(12) United States Patent
Tanaka

(10) Patent No.: US 7,433,568 B2
(45) Date of Patent: Oct. 7, 2008

(54) OPTICAL ELEMENT AND LIGHT IRRADIATION APPARATUS

(75) Inventor: Koichiro Tanaka, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 86 days.

(21) Appl. No.: 11/368,631

(22) Filed: Mar. 7, 2006

(65) Prior Publication Data

US 2006/0227676 A1 Oct. 12, 2006

(30) Foreign Application Priority Data

Mar. 31, 2005 (JP) ............................. 2005-102316

(51) Int. Cl.
  *G02B 6/00* (2006.01)
(52) U.S. Cl. ...................................... 385/133; 385/146
(58) Field of Classification Search ................ 385/133, 385/119, 146, 147
  See application file for complete search history.

(56) References Cited

U.S. PATENT DOCUMENTS

| 3,740,112 | A | * | 6/1973 | Lundgren | 385/133 |
| 4,744,615 | A | * | 5/1988 | Fan et al. | 385/146 |
| 4,793,694 | A | * | 12/1988 | Liu | 359/494 |
| 5,224,200 | A | * | 6/1993 | Rasmussen et al. | 385/146 |
| 5,625,738 | A | * | 4/1997 | Magarill | 385/146 |
| 6,067,146 | A | | 5/2000 | Mulkens et al. | 355/71 |
| 6,239,862 | B1 | | 5/2001 | Mulkens et al. | 355/71 |
| 2004/0058553 | A1 | | 3/2004 | Tanaka | 438/710 |
| 2004/0126077 | A1 | * | 7/2004 | Strobl et al. | 385/133 |
| 2004/0179807 | A1 | | 9/2004 | Tanaka | 385/146 |
| 2005/0031261 | A1 | | 2/2005 | Tanaka | 385/31 |
| 2005/0079645 | A1 | | 4/2005 | Moriwaka | 438/29 |
| 2006/0098915 | A1 | * | 5/2006 | Jenkins et al. | 385/15 |
| 2006/0227424 | A1 | * | 10/2006 | Wang et al. | 359/535 |

FOREIGN PATENT DOCUMENTS

| JP | 2002-184206 | 6/2002 | ............. 385/133 X |
| WO | WO 97/38356 | 10/1997 | ............. 385/133 X |

* cited by examiner

*Primary Examiner*—Brian M Healy
(74) *Attorney, Agent, or Firm*—Eric J. Robinson; Robinson Intellectual Property Law Office, P.C.

(57) ABSTRACT

It is an object of the present invention to provide an optical element which forms a beam spot with homogeneous energy distribution on an irradiated surface, and a light irradiation apparatus. It is another object of the invention to provide a manufacturing method of a semiconductor device using a beam spot with homogeneous energy distribution. One feature of the invention is to homogenize energy distribution of a beam spot on an irradiated surface by forming the optical element provided with a polygonal entrance and exit using a plurality of reflectors as side walls and introducing a beam to the optical element. Further, a beam spot with a desired size or shape can be obtained by making the reflectors movable. Furthermore, by using a light irradiation apparatus using the optical element, failure in manufacturing a semiconductor device can be reduced.

52 Claims, 13 Drawing Sheets

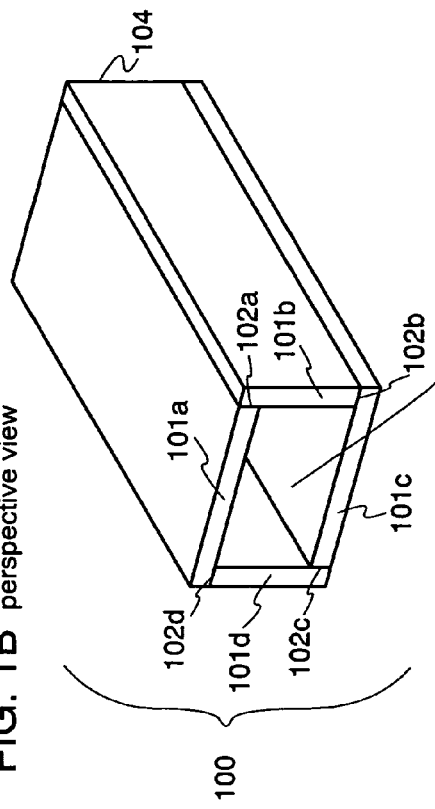
FIG. 1A front view
FIG. 1B perspective view
{ 100 }
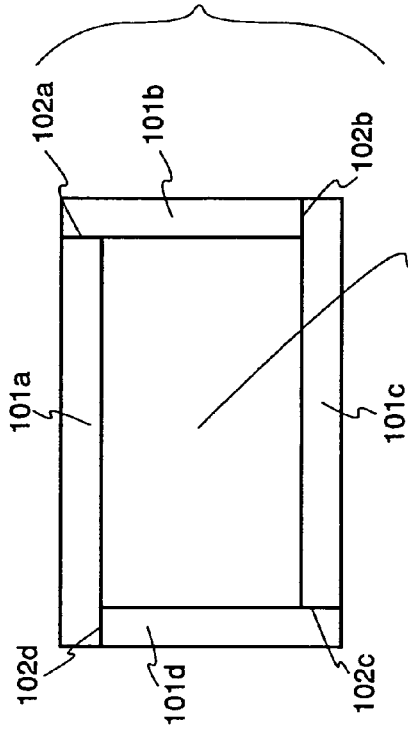
FIG. 1C front view
FIG. 1D perspective view
{ 110 }

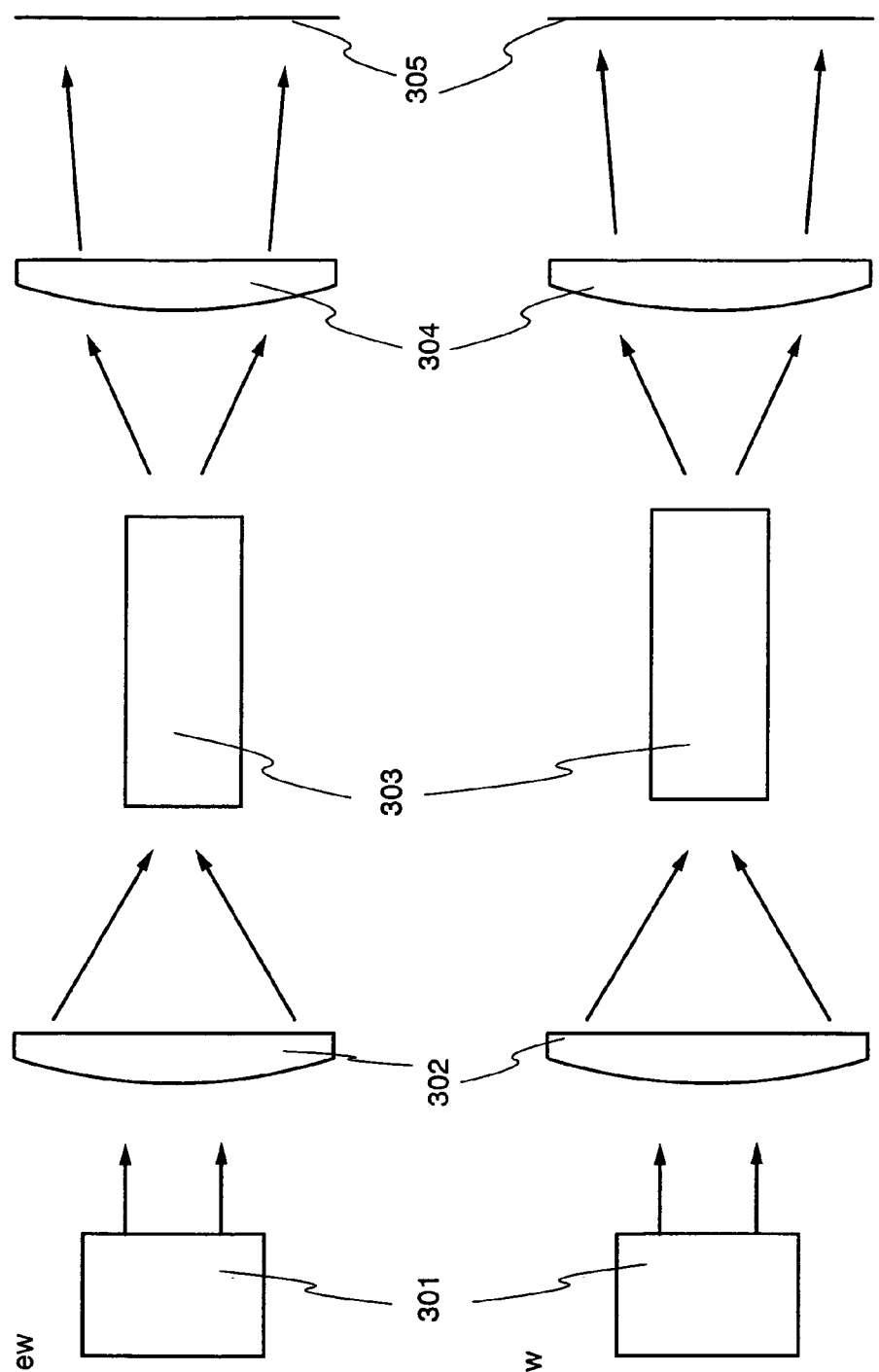
FIG. 3A plane view
FIG. 3B side view

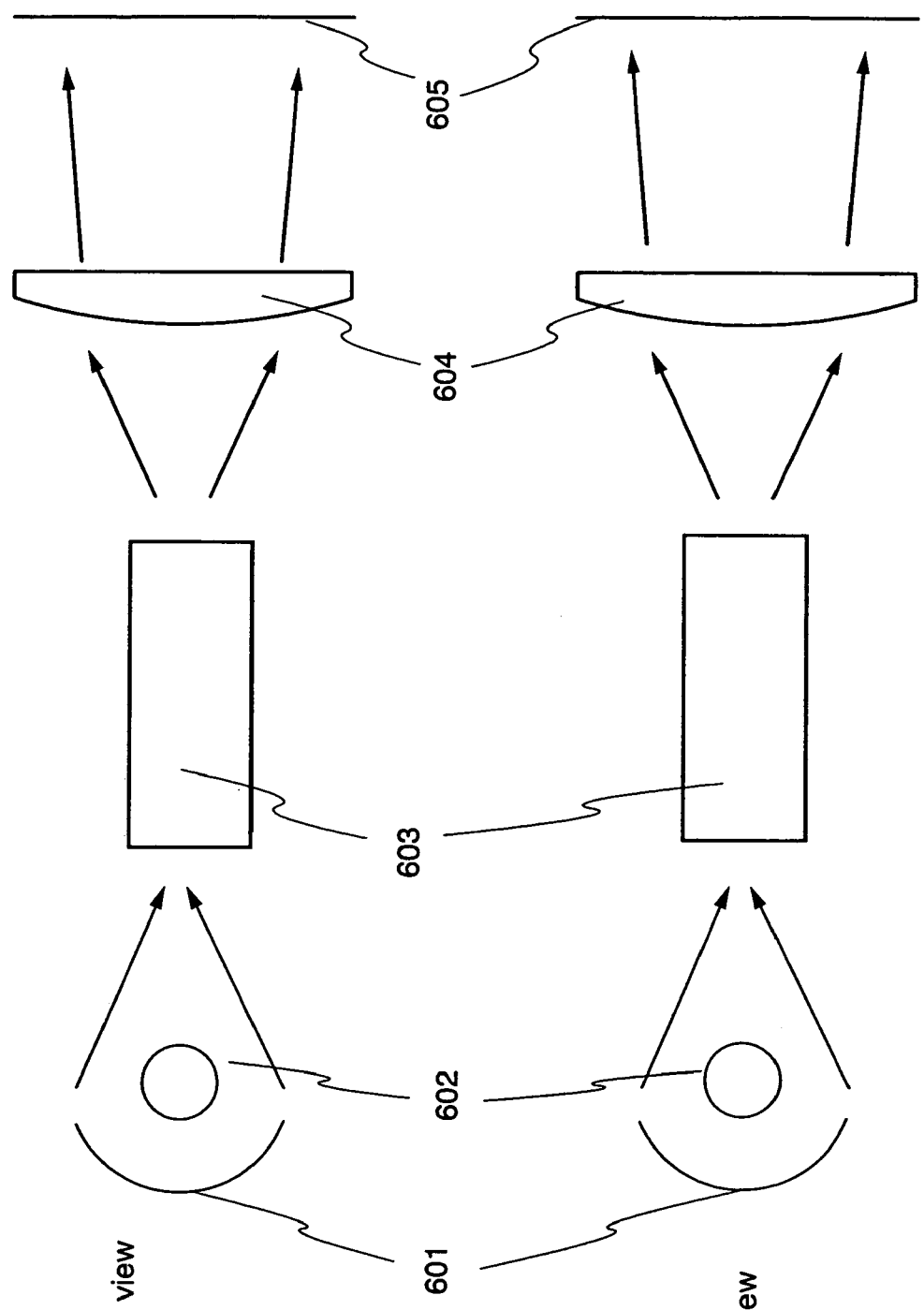
FIG. 6A plane view
FIG. 6B side view

DRIVER CIRCUIT PORTION | PIXEL PORTION
SWITCHING TFT | DRIVING TFT

FIG. 11A
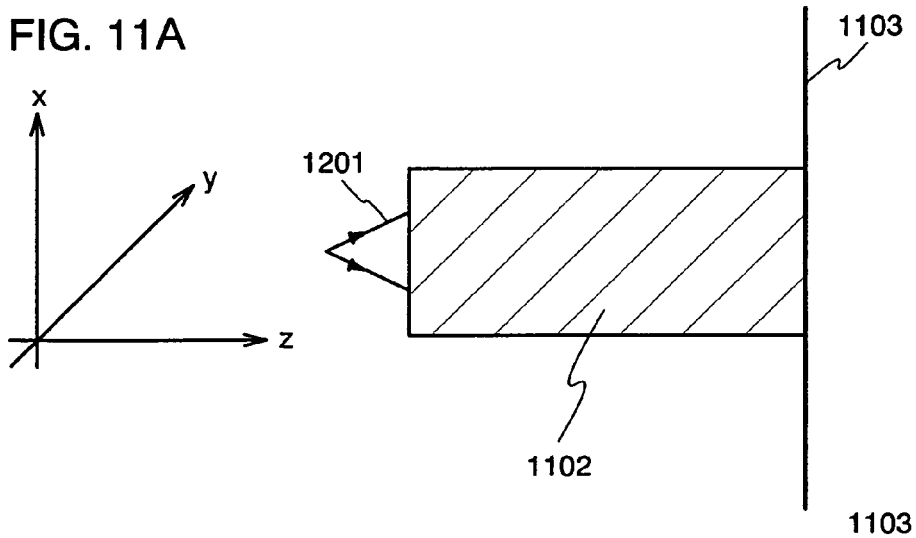
FIG. 11B xz plane view
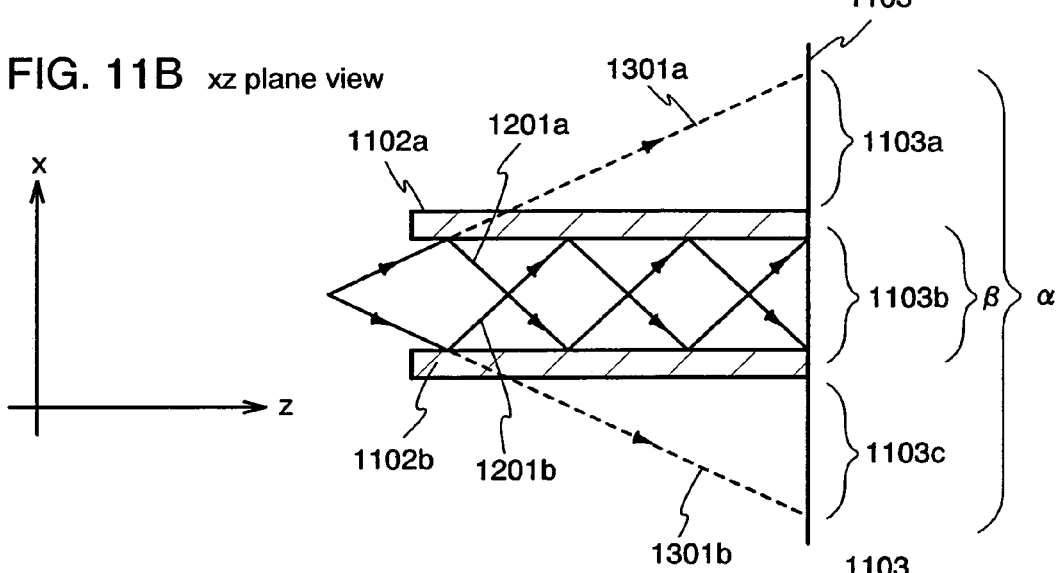
FIG. 11C yz plane view
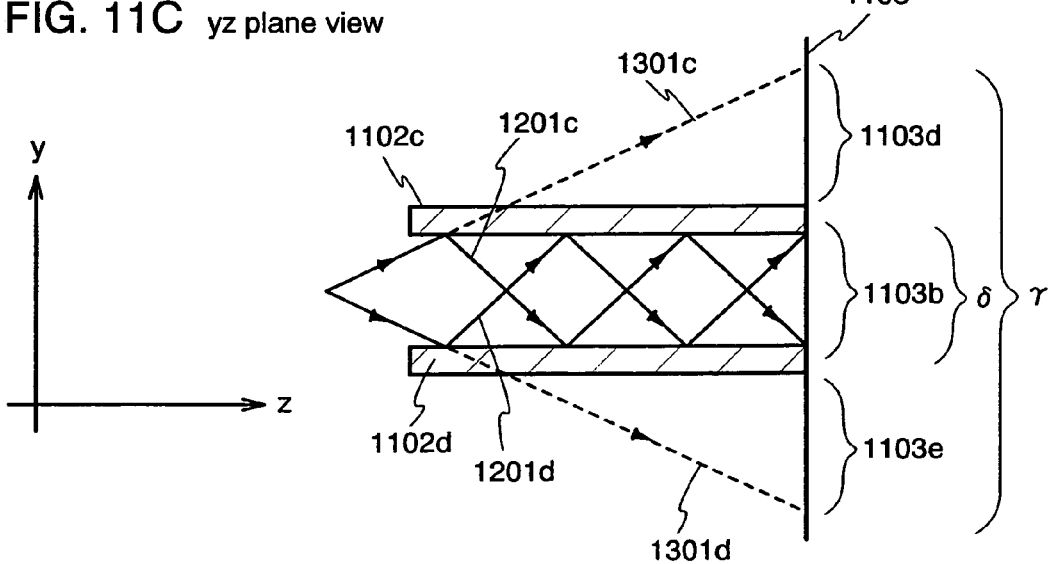

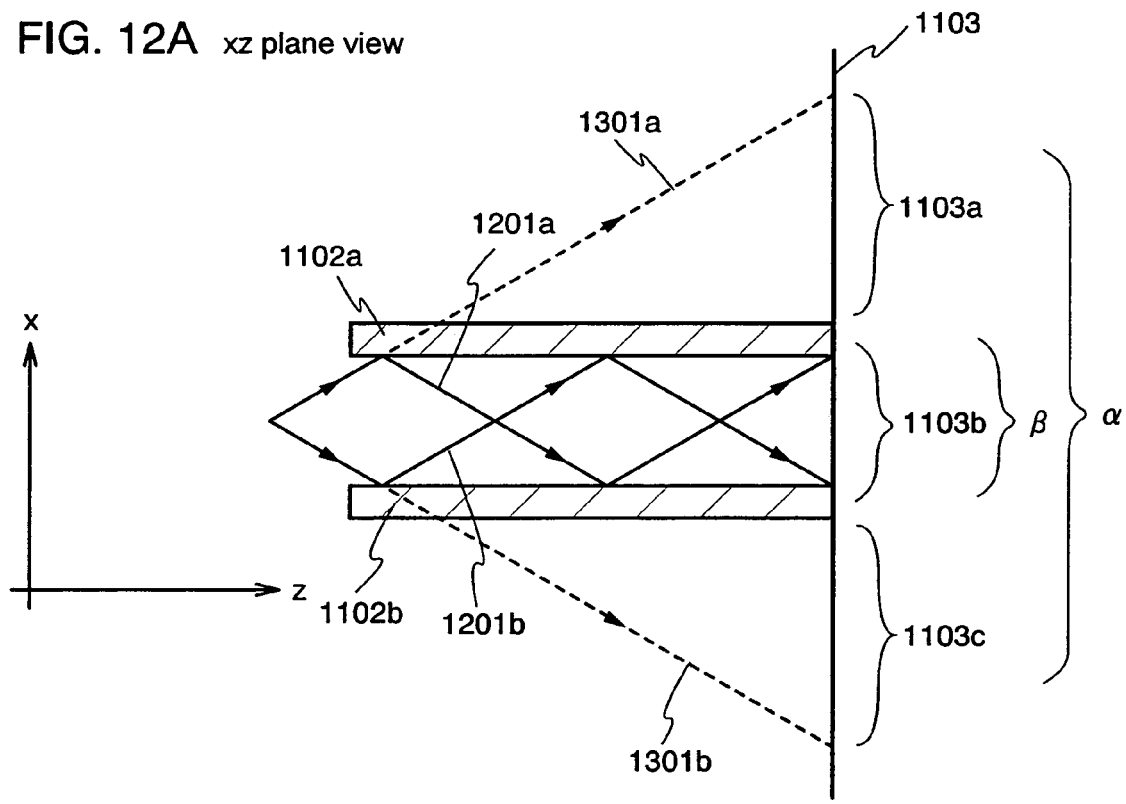
FIG. 12A xz plane view
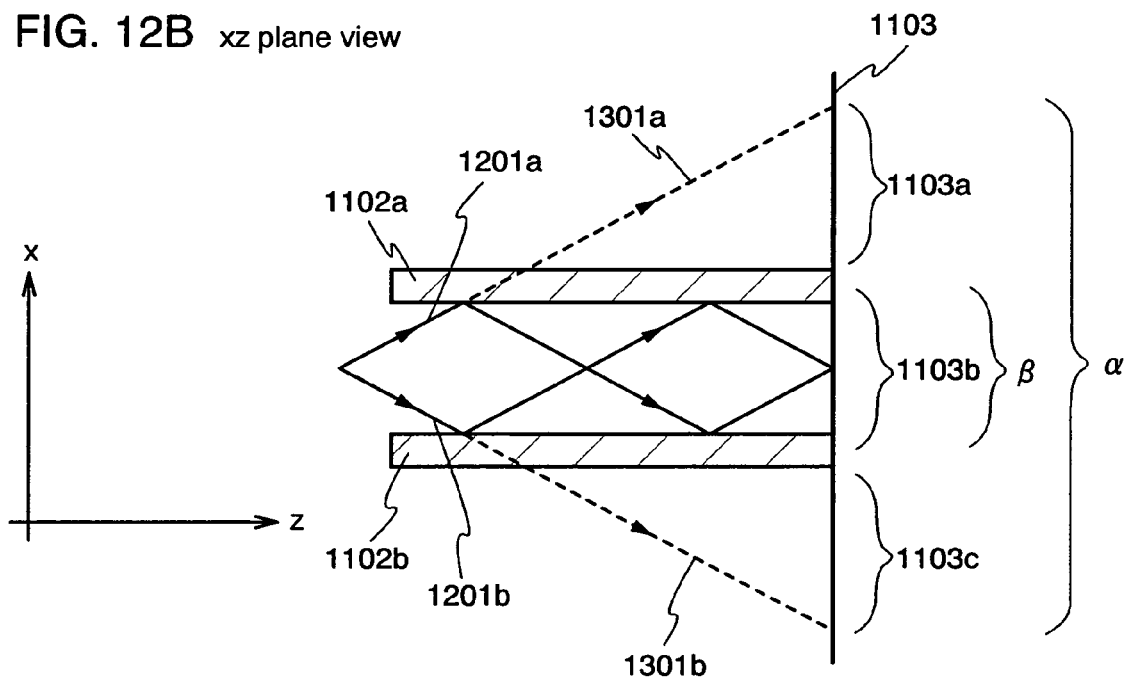
FIG. 12B xz plane view

OPTICAL ELEMENT AND LIGHT IRRADIATION APPARATUS

BACKGROUND OF THE INVENTION

1. Field of the Invention

The present invention relates to an optical element which homogenizes energy distribution of a beam spot on an irradiated surface in a specific region, and a light irradiation apparatus using the optical element. Moreover, the invention relates to a manufacturing method of a semiconductor device in which a crystalline semiconductor film formed using the light irradiation apparatus is used.

2. Description of the Related Art

In recent years, technique for manufacturing a thin film transistor (hereinafter, referred to as a TFT) over a substrate has been drastically advanced, and the application and development thereof to an active matrix display device has been promoted. In particular, a TFT in which a polycrystalline semiconductor film is used has higher electron field-effect mobility (also referred to as mobility) than a conventional TFT in which a non-single crystal semiconductor film is used; therefore, high speed operation can be conducted. Hence, the control of a pixel which is conventionally conducted in a driver circuit provided outside a substrate has been tried to conduct in a driver circuit formed on the same substrate as a pixel.

Meanwhile, as for a substrate used for a semiconductor device, a glass substrate is considered to be more promising substrate than a single crystal semiconductor substrate in terms of cost. The glass substrate has an advantage that an inexpensive and large-sized substrate can be easily manufactured compared with a synthesized quartz substrate, but also has a disadvantage that a melting point is lower than a synthesized quartz substrate. However, in the case where laser annealing is conducted using a laser beam to a semiconductor film formed on a glass substrate, it is possible to make only a temperature of the semiconductor film high, and accordingly, crystallization, flattening, or surface modification of the semiconductor film can be conducted by giving little thermal damage to the glass substrate. In addition, throughput is remarkably high compared with a heating means using an electrically-heated oven. Therefore, technique for conducting laser annealing to a non-single crystal semiconductor film (a non-single crystal semiconductor, namely a semiconductor having crystallinity such as polycrystal or microcrystal but not a single crystal, or an amorphous semiconductor) formed on a glass substrate is widely studied. Laser annealing herein used indicates technique for crystallizing a damaged layer or an amorphous layer formed on a semiconductor substrate or a semiconductor film or technique for crystallizing a non-single crystal semiconductor film formed on a substrate, and also includes technique which is applied to flattening or surface modification of a semiconductor substrate or a semiconductor film.

A crystalline semiconductor film manufactured by laser annealing has high mobility; therefore, the crystalline semiconductor film has been actively used for an active layer or the like of a TFT for a driver circuit included in an active matrix display device.

As for a laser beam used in the laser annealing, a laser beam oscillated from an excimer laser is frequently used. The excimer laser has advantages that it has high output and it can conduct repeated irradiation with high frequency. Moreover, the laser beam oscillated from the excimer laser has an advantage that absorption coefficient to a silicon film which is often employed as a semiconductor film is high. As a method for laser annealing, there is an irradiation method by which the shape of a beam spot on an irradiated surface is reformed by an optical system to be a rectangular shape having a fixed region, and the irradiated position of the laser beam is moved relatively to the irradiated surface. This method has high productivity and is industrially superior. In this specification, a beam to have a rectangular shape in its beam spot on the irradiated surface is referred to as a rectangular beam, and irradiation to an object to be irradiated using the rectangular beam is referred to as area irradiation. It is to be noted that, in this specification, the rectangular beam is acceptable as long as the shape of the beam spot on the irradiated surface is almost a rectangular shape. Thus, four interior angles of the rectangular beam are not required to be strictly a right angle, respectively, and may be rounded to some extent. In addition, a rectangular beam which has especially high aspect ratio (specifically, aspect ratio of 10 or more, preferably 100 to 10,000) is a linear beam, which is distinguished from the rectangular beam in this specification. In this specification, irradiation of the linear beam to an object to be irradiated by relatively moving the linear beam in a direction orthogonal to a direction in which the beam width of the linear beam is longer, is referred to as line irradiation.

The intensity distribution of the laser beam oscillated from a light source is generally Gaussian distribution, and in order to conduct homogeneous laser annealing, it is necessary to homogenize the intensity distribution of the laser beam. In recent years, a method for homogenizing intensity distribution of a laser beam, by which the laser beam is divided into a predetermined direction using a cylindrical lens array and each of the divided laser beam is overlapped in the same face, is frequently employed as a method for homogenizing intensity distribution of a laser beam. By using the beam formed as described above, laser annealing of a semiconductor film formed on a large substrate comes to be able to be conducted more effectively.

However, in the case of using a cylindrical lens array, processing precision of individual cylindrical lens becomes a problem. A cylindrical lens array is a line of a plurality of cylindrical lenses; however, it is impossible to completely uniform a radius of curvature or profile irregularity of each cylindrical lens. Therefore, individual laser beam divided by the cylindrical lens array cannot overlap to be conformed completely on the irradiated surface, and accordingly, a region where intensity distribution is reduced is generated in a beam to be formed. This can be a problem in conducting laser annealing to a semiconductor film. In the case where a TFT is manufactured using a semiconductor film to which laser annealing is conducted by a beam with inhomogeneous intensity distribution described above, and further, a liquid crystal or an organic EL display is manufactured using the TFT, fringe or color unevenness is generated on a display in some cases.

Further, a conventional light irradiation apparatus does not have a structure which can form a beam spot with a desired size in accordance with the size of a region to be irradiated. Hence, in spite of the size of the region to be irradiated, a processing such as laser annealing is conducted using a laser beam with a fixed size, which takes a fixed processing time regardless of the size of the region to be irradiated.

A photolithographic apparatus capable of changing the dimension of an optical waveguide is disclosed in Patent Document 1 (PCT Publication No. WO 97/38356). An optical waveguide shown in Patent Document 1 has a feature of having inner walls movable with respect to each other; however, the inner walls which form the optical waveguide move only in a direction orthogonal to a longitudinal direction of the optical waveguide (width direction of a static irradiation field). In other words, as shown in FIG. 5a or 5b of the Patent Document 1, the dimension itself in the longitudinal direction is not changed though the dimension of the direction orthogonal to the longitudinal direction is changed before and after the movement of the inner walls of the optical waveguide. Therefore, the shape of the optical waveguide is changed before and after the movement of the inner walls of the optical waveguide.

SUMMARY OF THE INVENTION

In view of the foregoing problems, it is an object of the present invention to provide technique which can improve homogeneity of intensity of a laser beam and homogenize energy distribution of a beam spot on an irradiated surface. Moreover, it is another object of the invention to provide technique which can form a beam spot with homogeneous energy distribution and a desired size on an irradiated surface.

Further, it is another object of the invention to provide technique which can optimize the size of a beam spot in accordance with an object to be irradiated and form a beam spot having a similar figure.

It is another object of the invention to provide technique which can improve homogeneity of intensity of a beam emitted from a light source such as a xenon lamp, a halogen lamp, or a high pressure mercury lamp, which is not limited to a laser beam, and homogenize energy distribution of a beam spot on an irradiated surface.

One feature of the invention is to obtain a beam spot with more homogeneous energy distribution on an irradiated surface. In other words, one feature of the invention is that variation of intensity distribution of a beam is corrected by introducing a beam to an optical element, and accordingly, a beam spot with more homogeneous energy distribution on an irradiated surface is formed. Moreover, another feature of the invention is to obtain a beam spot with homogeneous energy distribution and a desired size on an irradiated surface. It is to be noted that the size means an area, largeness, a dimension, or the like in this specification.

Specifically, another feature of the invention is that the optical element has a plurality of reflectors to form a polygonal entrance and exit. A beam enters the polygonal entrance of the optical element, then, the beam is reflected toward inside by the plurality of reflectors, and then, the beam is emitted from the exit of the optical element with intensity distribution of the beam homogenized. Accordingly, the energy distribution of the beam spot on the irradiated surface can be homogenized.

Another feature of the invention is an optical element which homogenizes energy distribution of a beam spot on an irradiation surface, including a polygonal entrance and exit, wherein the polygonal entrance and exit are formed by a plurality of reflectors, each of the plurality of reflectors is movable relatively to another adjacent reflector, and the shapes of the polygonal entrance and exit have similarity before and after the movement of the plurality of reflectors.

Another feature of the invention is an optical element which homogenizes energy distribution of a beam spot on an irradiation surface, including a rectangular entrance and exit, wherein the rectangular entrance and exit are formed by four reflectors, each of the four reflectors is movable relatively to another adjacent reflector, and the shapes of the rectangular entrance and exit have similarity before and after the movement of the four reflectors.

According to the optical element disclosed in the invention, the shape of the beam spot on the irradiated surface is a shape of the entrance and the exit of the optical element. According to the invention, the shape of the beam spot on the irradiated surface is acceptable as long as the shape roughly corresponds to the shape of the entrance and the exit of the optical element, and the shape is not necessary to be the same. For example, an interior angle of the beam spot may be rounded to some extent.

According to the optical element disclosed in the invention, the shapes of the entrance and the exit of the optical element have similarity before and after the movement of the reflectors.

According to the optical element disclosed in the invention, the shapes of the entrance and the exit of the optical element are rectangular shapes with golden ratio.

According to the optical element disclosed in the invention, the optical element is an optical waveguide.

According to the optical element disclosed in the invention, a mirror surface processing is conducted to a portion where the reflectors are adjacent to each other. A mirror surface processing in this specification means to polish so that reflectors slide easily in a portion where the reflectors are in contact with each other.

According to the optical element disclosed in the invention, central axes of the optical element and the polygonal entrance and exit of the optical element are fixed before and after the movement of the reflectors. In this specification, a central axis of an optical element and a central axis of a polygonal entrance and exit of the optical element each indicate an axis parallel to a traveling direction of a beam passing through the optical element.

According to the optical element disclosed in the invention, the beam entering the entrance at $60°<\theta<90°$ can be reflected when an incident angle of a beam entering the entrance of the optical element is indicated by $\theta$, and energy distribution of the beam spot can be homogenized on the irradiated surface.

Another feature of the invention is a light irradiation apparatus which homogenizes energy distribution of a beam spot on an irradiated surface, including a light source, an optical element provided with a polygonal entrance and exit, and a spherical lens which transfers to the irradiated surface a beam with homogeneous intensity distribution formed by the optical element, wherein the optical element has a plurality of reflectors which form the polygonal entrance and exit, each of the plurality of reflectors is movable relatively to another adjacent reflector, and the shapes of the polygonal entrance and exit have similarity before and after the movement of the plurality of reflectors.

Another feature of the invention is a light irradiation apparatus which homogenizes energy distribution of a beam spot on an irradiated surface, including a light source, an optical element provided with a rectangular entrance and exit, and a spherical lens which transfers to the irradiated surface a beam with homogeneous intensity distribution formed by the optical element, wherein the optical element has four reflectors which form the rectangular entrance and exit, each of the four reflectors is movable relatively to another adjacent reflector, and the shapes of the rectangular entrance and exit have similarity before and after the movement of the four reflectors.

According to the light irradiation apparatus disclosed in the invention, the shape of the beam spot on the irradiated surface is the shape of the entrance and the exit of the optical element.

According to the light irradiation apparatus disclosed in the invention, the shapes of the entrance and the exit of the optical element have similarity before and after the movement of the reflectors.

According to the light irradiation apparatus disclosed in the invention, the shapes of the entrance and the exit of the optical element are rectangular shapes with golden ratio.

According to the light irradiation apparatus disclosed in the invention, the optical element is an optical waveguide.

According to the light irradiation apparatus disclosed in the invention, a mirror surface processing is conducted to a portion where the reflectors are adjacent to each other.

According to the light irradiation apparatus disclosed in the invention, central axes of the optical element and the polygonal entrance and exit of the optical element are fixed before and after the movement of the reflectors.

According to the light irradiation apparatus disclosed in the invention, an optical element is included, which can reflect the beam entering the entrance at 60°<θ<90° when an incident angle of a beam entering the entrance of the optical element is indicated by θ, and homogenize energy distribution of the beam spot on the irradiated surface.

The light irradiation apparatus according to disclosed in the invention is a laser irradiation apparatus or an exposure apparatus.

According to the invention, a beam with homogeneous intensity distribution can be formed; therefore, a margin of power of a beam can be widened. The reason that a margin can be widened will be explained with reference to FIGS. 13A and 13B. FIG. 13A shows a shape of a laser beam with inhomogeneous intensity distribution. In general, the power of a laser beam is not fixed constantly, and the power changes measurably in some cases. Therefore, when power is increased to some extent in conducting laser annealing using the laser beam with inhomogeneous intensity distribution, each top of a beam shape exceeds energy range suitable for crystallization and possesses excessive energy, and accordingly, there is a fear that a semiconductor film is vaporized in the case of conducting laser annealing by using the semiconductor film as an irradiation object. Conversely, when power is lowered, a portion where energy is originally low in a beam shape is below energy range suitable for crystallization, which leads to a possibility that crystallization cannot be conducted due to energy shortage. On the other hand, as shown in FIG. 13B, in the case of using a laser beam with homogeneous intensity distribution, a beam shape does not exceed energy range suitable for crystallization even if power is changed to some extent, and accordingly, crystallization can be conducted stably and homogeneously. Therefore, in the case of conducting laser annealing by using the laser beam with homogeneous intensity distribution, which is formed according to the invention, a margin of power of the laser beam can be widened.

Further, by conducting laser annealing using the laser beam with homogeneous intensity distribution as described above, homogeneity of crystallinity over a substrate can be improved because intensity distribution of the laser beam on an irradiated surface can be homogenized. Therefore, when the invention is applied to mass production line of a TFT, variation in electric characteristics is reduced, and accordingly, reliability can be enhanced and a TFT with high operating characteristics can be produced efficiently. In particular, an EL display device easily generates failure such as fringe or color unevenness due to variation or the like in electric characteristics compared with other display devices; therefore, it is extremely effective to conduct laser annealing by using the laser beam with homogeneous intensity distribution as described above.

Further, the light irradiation apparatus according to the invention can conduct area irradiation; therefore, irradiation can be conducted to the entire surface all at once depending on largeness, an area, or a shape of a region to be irradiated. Thus, productivity can be improved and a display or the like can be formed in a homogeneous region; therefore, performance of a display or the like can be significantly improved. This feature is especially effective for an EL display device which is sensitive to variation in electric characteristics of a TFT, which is advantageous in manufacturing an EL display device in which fringe or unevenness is unnoticeable. Moreover, in the case of line irradiation, 10 shots to 50 shots are required for the number of irradiation to conduct laser crystallization to a non-single crystal semiconductor film; however, in the case of area irradiation, the range from 1 shot to 10 shots is sufficient for the number of irradiation. Therefore, by employing area irradiation, the number of irradiation can be reduced compared with line irradiation, and accordingly, a lifetime of an irradiation apparatus can be extended drastically. As a result, running cost for maintenance or the like of an irradiation apparatus can be reduced and cost in manufacturing a TFT can be reduced.

Operating characteristics and reliability of a display device can be improved by applying a TFT formed using a light irradiation apparatus according to the invention to an active matrix display device or a display device having a light emitting element typified by an EL element with these advantages satisfied.

Further, the optical element according to the invention can change the size of an entrance and an exit where a beam enters. Therefore, the size of a beam spot on an irradiated surface can be easily changed in accordance with the size of a region to be irradiated.

Furthermore, by using the optical element according to the invention, a similar figure of the shape of the beam spot on the irradiated surface can be kept before and after the change of the size of the entrance and the exit. Therefore, for example, in the case where the basic shape of the beam is made to be a rectangular shape with golden ratio of a display, an effect is obtained which can keep golden ratio of a display before and after the change even if the size of the entrance and the exit is changed in accordance with a region to be irradiated. The golden ratio means "harmonic and beautiful ratio" which was found by ancient people, and an example of a rectangle in which a ratio of a long side to a short side of a rectangle is 1:0.6 is well known. In general, it is said that a shape with a splitting ratio like golden ratio is most pleasant for human beings, and a shape close to golden ratio is employed to a display or the like in many cases.

As described above, in a manufacturing process of a semiconductor device, it is possible to have a wide margin of a beam and a yield is increased by conducting laser annealing, light-exposure, or the like using a light irradiation apparatus disclosed in the invention. Further, throughput can be improved by changing the size of a beam spot on the irradiation surface in accordance with the region to be irradiated, and manufacturing cost of a semiconductor device can be reduced.

These and other objects, features and advantages of the present invention will become more apparent upon reading of the following detailed description along with the accompanied drawings.

BRIEF DESCRIPTION OF THE DRAWING

FIGS. 1A to 1D are views showing an example of an optical element according to the present invention;

FIGS. 3A and 3B are views showing an example of a light irradiation apparatus according to the invention;

FIGS. 6A and 6B are views showing an example of a light irradiation apparatus according to the invention;

FIGS. 11A to 11C are views showing homogenization of energy distribution by an optical element;

FIGS. 12A and 12B are views showing homogenization of energy distribution by an optical element.

DETAILED DESCRIPTION OF THE INVENTION

Figure 2B:
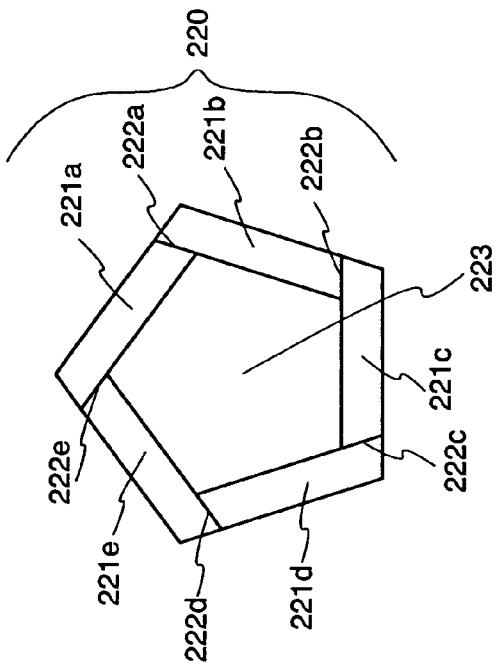
FIGS. 2A to 2D are views showing an example of an optical element according to the invention.

Embodiment modes according to the present invention will be explained in detail with reference to the drawings. However, it is to be easily understood by those skilled in the art that embodiments and details herein disclosed can be modified in various ways without departing from the purpose and the scope of the present invention. Therefore, it should be noted that the description of embodiment modes to be given below should not be interpreted as limiting the present invention. Through the drawings of the embodiments, like components are denoted by like numerals as of these embodiments with each other.

First, a method for homogenizing intensity distribution of a beam by using an optical element disclosed in the present invention will be explained with reference to FIGS. 11A to 11C. FIG. 11A is a plan view of an optical element according to the invention. FIGS. 11B and 11C are plan views of two directions (referred to as x direction and y direction) orthogonal to a traveling direction (referred to as z direction) of a beam entering the optical element, and FIG. 11B is a xy plan view and FIG. 11C is an yz plan view. It is to be noted that an x direction and a y direction are also orthogonal to each other.

In FIGS. 11A to 11C, a method for homogenizing intensity distribution of a beam by an optical element having two pairs of two reflectors facing each other will be explained. An optical element 1102 having two pairs of two reflectors facing each other (1102a and 1102b, and 1102c and 1102d), and an irradiated surface 1103 are prepared to make a beam enter in a z direction. In FIGS. 11A to 11C, beams 1201a to 1201d at the time that the optical element 1102 exists are each indicated by a solid line, and beams 1301a to 1301d at the time that the optical element 1102 does not exist are each indicated by a dashed line. The beams 1301a to 1301d which enter in the z direction at the time that the optical element 1102 does not exist reach regions 1103a to 1103e of the irradiated surface 1103 as shown by the dashed line.

On the other hand, when the optical element 1102 exists, a beam is reflected by the reflectors 1102a to 1102d of the optical element 1102 and all beams reach a region 1103b of the irradiated surface 1103 as shown by the beams 1201a to 1201d. In other words, all beams, which reach the regions 1103a and 1103c to 1103e of the irradiated surface 1103 when the optical element 1102 does not exist, reach the region 1103b of the irradiated surface 1103 when the optical element 1102 exists. Therefore, when a beam enters the optical element 1102, the beam is reflected repeatedly in the optical element to reach the irradiated surface 1103. That is, the entering beams overlap on the region 1103b in the irradiated surface 1103, which is the same position, so as to be folded. In FIG. 11B, when a total length of light spread 1103a to 1103c on the irradiated surface 1103 in the case where the optical element 1102 does not exist is indicated by α and a length of light spread 1103b on the irradiated surface 1103 in the case where the optical element 1102 exists is indicated by β, (α/β) corresponds to the division number of a beam entering the optical element 1102.

In the same manner, in FIG. 11C, when a total length of light spread 1103d, 1103b, and 1103e on the irradiated surface 1103 in the case where the optical element 1102 does not exist is indicated by γ and a length of light spread 1103b on the irradiated surface 1103 in the case where the optical element 1102 exists is indicated by δ, (γ/δ) corresponds to the division number of a beam entering the optical element 1102. Thus, intensity distribution of the beam in an overlapped position is homogenized by dividing the laser beam entering the optical element 1102 and making the divided beams overlap on the same position. It is preferable to adjust a beam diameter of the entering beam so that each of (α/β) and (γ/δ) corresponding to the division number of the beam entering the above optical element 1102 is an integer number because the divided beams can overlap completely on the same position. However, it is realistically difficult to adjust the beam diameter of the entering beam so that each of (α/β) and (γ/δ) is an integer number completely; therefore, (α/β) and (γ/δ) may be in a range satisfying the following formulas (1) and (2). More preferably, (α/β) and (γ/δ) may be in a range of the following formulas (3) and (4). It is to be noted that, in the following formulas (1) to (4), Q represents (α/β) or (γ/δ) which is the division number of the beam entering the optical element, and Z is an integer number.

$$0 \leq Q-Z \leq 0.2 \tag{1}$$

$$0.8 \leq Q-Z < 1 \tag{2}$$

$$0 \leq Q-Z \leq 0.1 \tag{3}$$

$$0.9 \leq Q-Z < 1 \tag{4}$$

More preferably, the beam diameter of the entering beam may be adjusted so that each of (α/β) and (γ/δ), which is the division number of the beam entering the above optical element 1102, is an odd integer number. FIG. 12A shows a case where (α/β), which is the division number of the beam entering an optical element 1102, is an odd integer number. FIG. 12B shows a case where (α/β), which is the division number of the beam entering an optical element 1102, is an even integer number. In the case of FIG. 12A, beams of reflected beams 1201a and 1201b overlap each other completely on an irradiated surface 1103b in an irradiated surface 1103.

On the other hand, in the case of FIG. 12B, beams including reflected beams 1201a and 1201b overlap each other on an irradiated surface 1103b in an irradiated surface 1103. Therefore, intensity distribution of a beam can be further homogenized on an irradiated surface in the case of FIG. 12A in which beams overlap each other completely. Although a case of the division number (α/β) of a beam entering the optical element 1102 is explained in FIGS. 12A and 12B, the same is true of a case where the division number of a beam entering the optical element 1102 is (γ/δ); therefore, the explanation is omitted here.

Embodiment Mode 1

The present invention relates to an optical element which homogenizes energy distribution of a beam spot on an irradiated surface. Hereinafter, an optical element according to the invention will be specifically explained with reference to FIGS. 1A to 1D.

The optical element disclosed in the invention has a plurality of reflectors to form a polygonal entrance and exit. It is to be noted that the shapes of the entrance and the exit according to the invention are the same. The intensity distribution of a beam which is entered the optical element is homogenized in the optical element, then, the beam reaches an irradiated surface, which forms a beam spot with homogeneous energy distribution on the irradiated surface. At this time, the shape of the entrance and the exit of the optical element becomes a shape of the beam spot on the irradiated surface.

In accordance with the optical element disclosed in the invention, the size or shape of the entrance and the exit can be changed by moving the reflectors of the optical element. It is to be noted that the size of the entrance and the exit which is changed by moving the reflectors of the optical element means an area, largeness, a dimension, or the like.

FIG. 1A is a front view of an optical element according to the invention, and FIG. 1B is a perspective view of FIG. 1A. FIG. 1C is a front view after the movement of reflectors, which are side walls of the optical element shown in FIG. 1A, and FIG. 1D is a perspective view of FIG. 1C.

In this embodiment mode, an optical element 100 has four rectangular reflectors 101a to 101d to form a rectangular entrance 103 and exit 104. As the reflector, an object in which the surface of a base material such as resin, glass, quartz, or ceramic is coated with a dielectric multilayer film may be used. The material, the number of layers, and the thickness of the dielectric multilayer film may be appropriately designed so that a desired reflecting property is obtained. The material, the number of layers, and the thickness of the dielectric multilayer film are preferably designed to conduct the coating so that a beam entering at 60°<incident angle θ<90° can be reflected sufficiently. As the material of the dielectric multilayer film, oxide of tantalum, titanium, vanadium, silicon, zirconium, hafnium, tin, indium, aluminum, yttrium, magnesium, or scandium; fluoride of sodium, lithium, magnesium, calcium, barium, holmium, lanthanum, gadolinium, or neodymium; and the like are given. Of course, metal having a luster such as gold, silver, copper, nickel, or rhodium; or an object in which the surface of the base material is coated with the metal film having a luster may be used. In the case of using an object in which the surface of the base material is coated with the dielectric multilayer film, the metal film, or the like, the optical element is formed so that entering beam is reflected at the coated surface such as the dielectric multilayer film or the metal film.

Each of the four rectangular reflectors 101a to 101d of the optical element 100 is a side of the entrance 103 and the exit 104. Intensity distribution of a beam entering the entrance 103 in FIG. 1A in a perpendicular direction with respect to a paper is homogenized in the optical element 100, then, the beam reaches an irradiated surface. The spot of the beam which has reached the irradiated surface has a shape of the entrance 103 and the exit 104 of the optical element 100. It is to be noted that the shapes of the entrance and the exit are the same; therefore, the front view of the optical element 100 from an entrance 104 side in FIG. 1B is the same as FIG. 1A.

Further, in the optical element 100, the reflectors 101a to 101d are movable, and a mirror surface processing is conducted to a portion where the reflectors are to be in contact with each other. By conducting a mirror surface processing to the portion where the reflectors are to be in contact with each other, the size of the entrance and the exit can be changed by sliding the reflectors of the optical element while keeping a similar figure of a polygon of the entrance 103 and the exit 104 of the optical element 100 which is formed by using the reflectors 101a to 101d as side walls. It is to be noted that a mirror surface processing in this specification is to conduct polishing so that reflectors are easily slid in a portion where the reflectors are in contact with each other. In this embodiment mode, a mirror surface processing is conducted to a portion 102a where the reflectors 101a and 101b are in contact with each other, a portion 102b where the reflectors 101b and 101c are in contact with each other, a portion 102c where the reflectors 101c and 101d are in contact with each other, and a portion 102d where the reflectors 101a and 101d are in contact with each other. Power is applied to the optical element 100 in a direction indicated by an arrow of a solid line shown in FIGS. 1C and 1D, the four reflectors 101a to 101d are slid, and the size of the entrance 103 and the exit 104 is changed. FIGS. 1C and 1D are views in which the four reflectors 101a to 101d of the optical element 100 in FIGS. 1A and 1B are slid to change the size of the entrance 103 and the exit 104. Here, a case where the entrance is made to be smaller from FIG. 1A to FIG. 1C is shown here; however, the entrance may be made to be larger from FIG. 1C to FIG. 1A by applying power to an optical element 110 in a direction opposite to the direction indicated by the arrow of the solid line shown in FIGS. 1C and 1D.

As described above, the shape of an entrance 105 in FIGS. 1C and 1D formed by sliding the reflectors 101a to 101d in FIGS. 1A and 1B is similar to that of the entrance 103 in FIGS. 1A and 1B. It is to be noted that the shapes of the entrance 103 and the exit 104 are the same; therefore, the shape of an exit 106 in FIG. 1D is similar to the exit 104 in FIG. 1B. Further, central axes of the optical element 100 and the entrance 103 and exit 104 in FIGS. 1A to 1B and central axes of the optical element 110 and the entrance 105 and exit 106 in FIGS. 1C and 1D are fixed before and after the slide of the reflectors 101a to 101d. It is to be noted that the central axis of the optical element 100 and the central axis of the entrance 103 and the exit 104 of the optical element 100 each indicate a central axis parallel to a traveling direction of a beam passing through the optical element 100. The same is true of the central axis of the optical element 110, and the central axis of the entrance 105 and the exit 106 of the optical element 110.

As described in this embodiment mode, in the optical element according to the invention, the size of the entrance and the exit of the optical element can be changed by moving the reflectors. By using the optical element according to the invention, a beam spot with homogeneous energy distribution and a desired size on an irradiated surface can be formed, and scan speed can be enhanced depending on an irradiated region; therefore, throughput is improved. Although the optical element having a rectangular entrance and exit is explained in this embodiment mode, the optical element according to the invention is not limited thereto, and the optical element may be formed so that the entrance and the exit have a polygonal shape.

Furthermore, as described in this embodiment mode, the shapes of the entrance and the exit to be formed have similarity to each other before and after the movement of the reflectors for changing the size of the entrance and the exit of the optical element according to the invention. Therefore, for example, in the case where the entrance and the exit before the movement of the reflectors have a rectangular shape with golden ratio, the entrance and the exit after the movement of the reflectors can keep a rectangular shape with golden ratio.

In this embodiment mode, the shapes of the entrance and the exit to be formed are made to be similar to each other before and after the movement of the reflectors for changing the size of the entrance and the exit of the optical element; however, the invention is not limited thereto. For example, in the case where regions to be irradiated having different shapes are desired to be irradiated, the shapes of an entrance and an exit to be formed may be changed by moving reflectors to form a beam spot with homogeneous energy distribution and a desired shape on an irradiated surface. In this case, the shapes of the entrance and the exit to be formed are not similar to each other before and after the movement of the reflectors.

The optical element explained in this embodiment mode can be used as an optical waveguide typified by an optical fiber or the like.

Embodiment Mode 2

In this embodiment mode, an optical element in which the shape of an entrance is different from that in Embodiment Mode 1 will be explained with reference to FIGS. 2A to 2D. FIGS. 2A to 2D are front views of the optical element which will be explained in this embodiment mode.

Figure 2D:
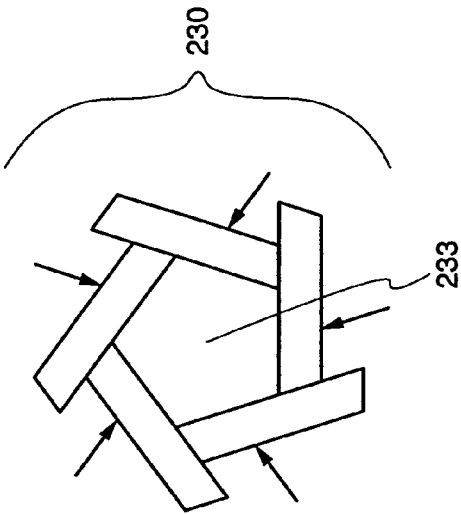
Figure 2A:
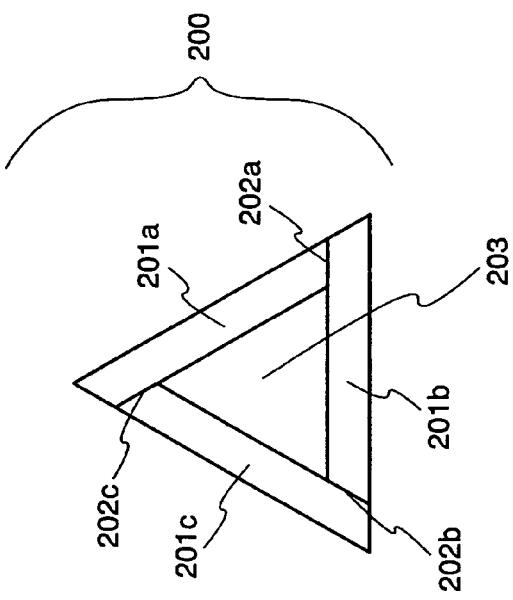

FIG. 2A is an optical element 200 having a triangular entrance 203, and FIG. 2B is an optical element 220 having a pentagonal entrance 223. Each optical element has a plurality of reflectors for forming a polygonal entrance and exit in the same manner as the optical element described in Embodiment Mode 1. It is to be noted that the shape of the exit is the same as the shape of the entrance in the same manner as Embodiment Mode 1. In FIG. 2A, the optical element 200 has three reflectors 201a to 201c for forming the triangular entrance 203 of the optical element 200, and in FIG. 2B, the optical element 220 has five reflectors 221a to 221e for forming the pentagonal entrance 223 of the optical element 220.

Figure 2C:
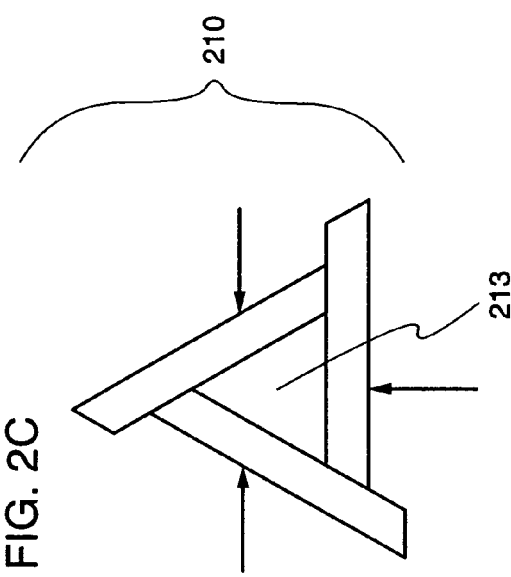

In the optical element 200, a mirror surface processing is conducted to portions 202a to 202c where the reflectors are to be in contact with each other. In the same manner as in Embodiment Mode 1, the size of the entrance can be changed by sliding the reflectors of the optical element while keeping a similar figure of a polygon of the entrance of the optical element. FIG. 2C is a view of an optical element 210 in which the size of the entrance is changed by sliding the reflectors 201a to 201c of the optical element 200. The shape of an entrance 213 of the optical element 210 is similar to the shape of the entrance 203 of the optical element 200. Further, central axes of the optical element 200 and the entrance 203 in FIG. 2A and central axes of the optical element 210 and the entrance 213 in FIG. 2C are fixed before and after the slide of the reflectors 201a to 201c.

FIG. 2D is a view of an optical element 230 in which the size of the entrance is changed by sliding reflectors 222a to 222e of the optical element 220. The shape of an entrance 233 of the optical element 230 is also similar to the shape of the entrance 223 of the optical element 220. Further, central axes of the optical element 220 and the entrance 223 in FIG. 2B and central axes of the optical element 230 and the entrance 233 in FIG. 2D are fixed before and after the slide of the reflectors 222a to 222e.

As described in this embodiment mode, in the optical element according to the invention, the size of the entrance and the exit of the optical element can be changed by moving the reflectors. By using the optical element according to the invention, a beam spot with homogeneous energy distribution and a desired size on an irradiated surface can be formed. As a result, scan speed can be enhanced depending on an irradiated region; therefore, throughput is improved. Although the optical element provided with an entrance and an exit having a triangular shape and a pentagonal shape is explained in this embodiment mode, the optical element according to the invention is not limited thereto, and the optical element may be formed so that the entrance and the exit have a polygonal shape.

In this embodiment mode, the shapes of the entrance and the exit to be formed are made to be similar to each other before and after the movement of the reflectors for changing the size of the entrance and the exit of the optical element; however, the invention is not limited thereto. For example, in the case where regions to be irradiated having different shapes are desired to be irradiated, the shapes of an entrance and an exit to be formed may be changed by moving reflectors to form a beam spot with homogeneous energy distribution and a desired shape on an irradiated surface. In this case, the shapes of the entrance and the exit to be formed are not similar to each other before and after the movement of the reflectors.

The optical element explained in this embodiment mode can be used as an optical waveguide typified by an optical fiber or the like.

Embodiment Mode 3

In this embodiment mode, an optical system of a light irradiation apparatus will be explained, in which a light source, an optical element disclosed in the present invention described above, and a convex spherical lens between the light source and the optical element and between the optical element and an irradiated surface, respectively, are arranged.

Figure 4A:
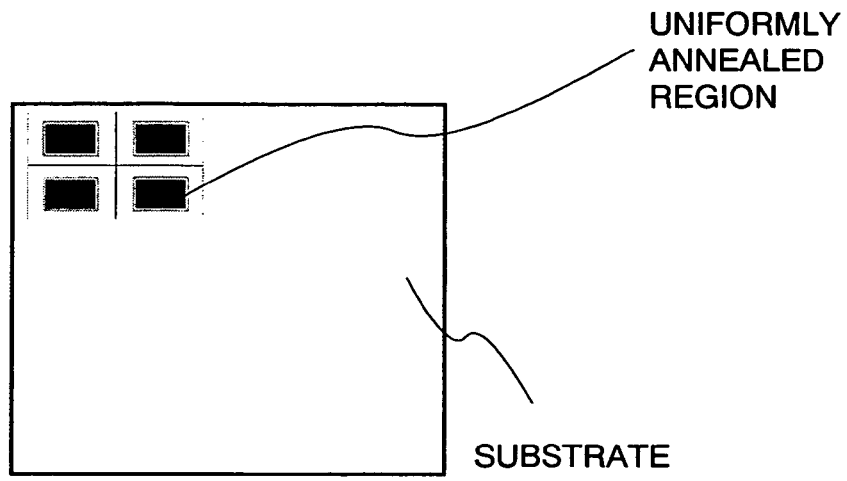
FIGS. 4A and 4B are views showing a spot of a beam emitted by a light irradiation apparatus according to the invention.
Figure 4B:
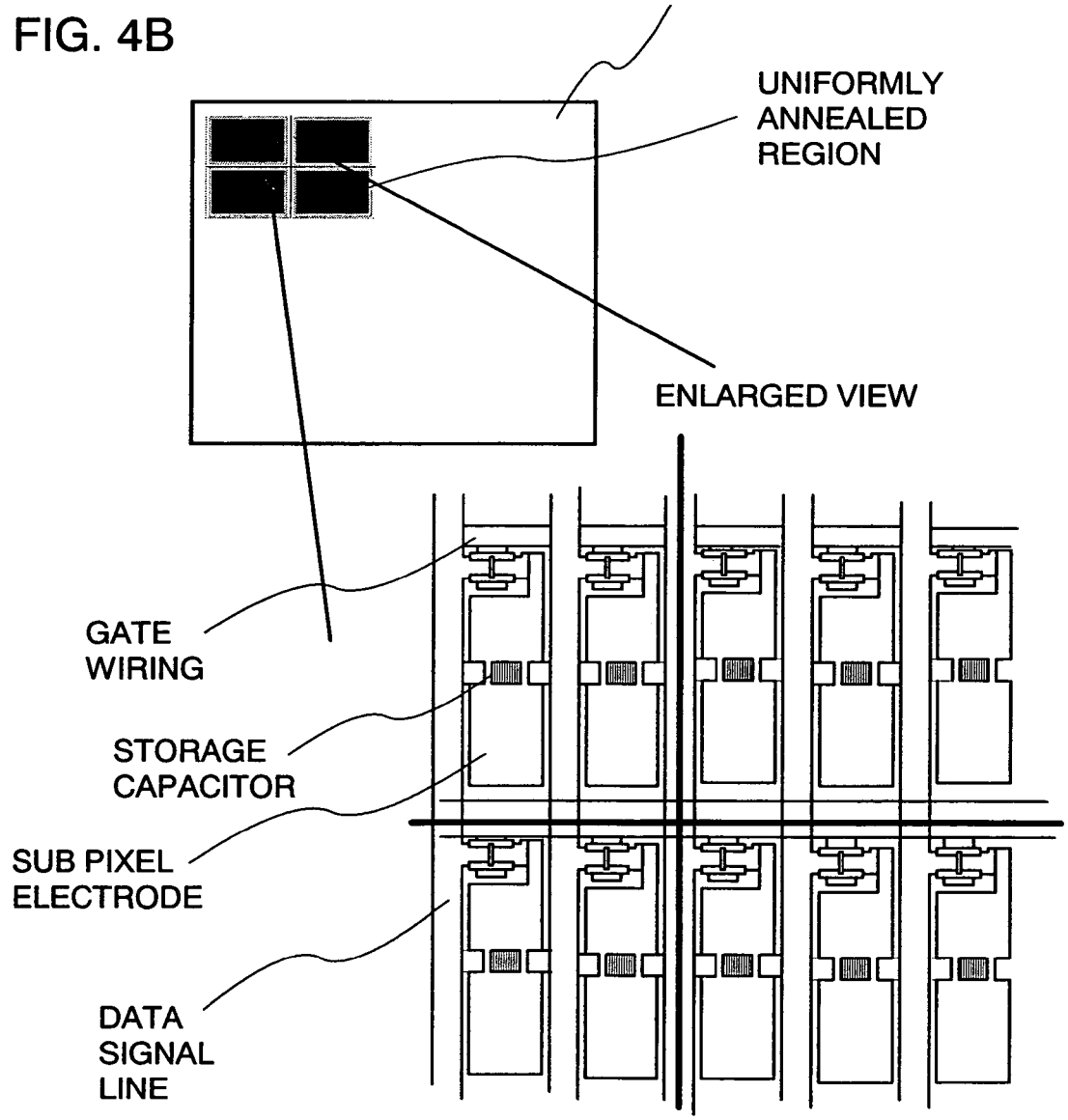

In FIGS. 3A and 3B, a beam propagates in a direction indicated by an arrow. In FIGS. 3A and 3B, the beam emitted from a light source 301 is converged by a convex spherical lens 302. In this embodiment mode, a laser oscillator is used as the light source; however, in addition to this, a xenon lamp, a halogen lamp, a high pressure mercury lamp, or the like can be used. In the case where the xenon lamp, the halogen lamp, and the high pressure mercury lamp are used as the light source, an elliptical mirror is preferably arranged in the opposite side of the irradiated surface with respect to the light source because a beam emitted from the lamp is scattered in all directions. By providing the elliptical mirror, more amount of light can be effectively utilized. The beam converged by the convex spherical lens 302 enters an optical element 303 according to the invention. The optical element 303 is formed by a plurality of reflectors so that the entrance and the exit have a polygonal shape as explained in Embodiment Mode 1 or 2. Therefore, the beam is reflected in the optical element so as to go from all directions toward inside, and is reformed into a polygonal beam with homogenized intensity distribution in the entrance of the optical element 303. In this embodiment mode, the beam is reformed into a rectangular beam. Then, by a convex spherical lens 304, the beam emitted from the optical element 303 is adjusted in largeness in accordance with the intended use and transferred to an irradiated surface 305 to form a rectangular beam spot with homogeneous energy distribution on the irradiated surface 305. In this embodiment mode, as shown in FIG. 4B, a laser beam is emitted using a non-single crystal semiconductor film formed on a glass substrate as an irradiated surface in such a way that the laser beam is emitted to the same position for 1 shot to 10 shots, preferably 3 shots, then, the irradiated surface is moved in a longitudinal direction or a horizontal direction by the length of a long side or a short side of the rectangular beam spot to be irradiated in the same manner to conduct laser annealing. It is to be noted that a practitioner may determine the number of shots according to the device to be manufactured.

According to the invention, it is possible to form a polygonal beam having sharp energy distribution in the edge portion. In this embodiment mode, a rectangular beam spot having the sharp energy distribution in the edge portion can be formed on the irradiated surface 305. FIG. 4A shows an example of a substrate annealed by a conventional rectangular laser beam not having the sharp intensity distribution in the edge portion, and FIG. 4B shows an example of a substrate annealed by a rectangular laser beam according to the invention having the sharp intensity distribution in the edge portion. In FIG. 4A, the conventional rectangular laser beam does not have the sharp energy distribution in the edge portion of the rectangular beam spot to be formed; therefore, a region annealed homogeneously is small in each rectangular beam spot, which means an available region is small. On the other hand, in FIG. 4B, the rectangular laser beam according to the invention has the sharp energy distribution in the edge portion of the rectangular laser beam to be formed; therefore, an available region in each rectangular beam spot can be large. Accordingly, in the case of manufacturing a TFT over the substrate after the laser annealing is conducted thereto, more TFTs can be manufactured. Moreover, as shown in the enlarged view, a TFT can be manufactured in the boundary between the adjacent rectangular beam spots at the same interval as in the rectangular beam spot. Thus, it is possible to manufacture a panel having no unevenness when, for example, a liquid crystal panel is manufactured using such a substrate.

Although the rectangular beam spot is formed in this embodiment mode, a polygonal beam spot can be formed by changing the shapes of the entrance and the exit of the optical element. Further, the size of the polygonal (rectangular) beam spot can be changed by sliding the reflectors of the optical element while keeping the similar figure of the beam spots.

Further, a case is explained in this embodiment mode, in which the light source, the optical element, and the convex spherical lens between the light source and the optical element and between the optical element and the irradiated surface, respectively, are arranged; however, the invention is not limited to the above structure. For example, a structure in which a plurality of convex spherical lenses are arranged may be employed, or a structure in which a convex spherical lens is arranged only between a light source and an optical element or between an optical element and an irradiated surface may be employed. In addition, a plurality of lenses may be combined to serve as a convex spherical lens. For example, a meniscus lens, a double convex lens, and a meniscus lens can serve as a convex spherical lens by being combined in this order.

Embodiment Mode 4

Figure 5A:
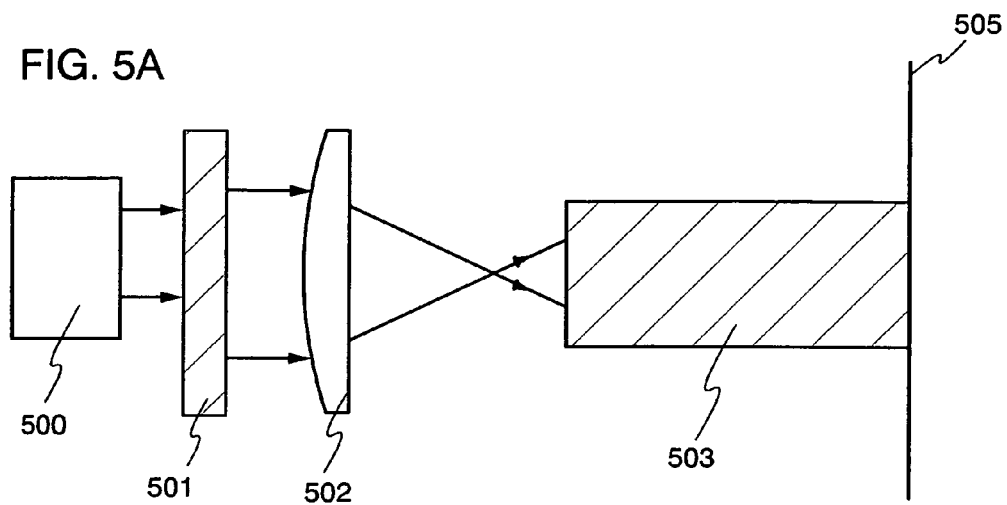
FIGS. 5A to 5C are views showing an example of a light irradiation apparatus according to the invention.
Figure 5B:
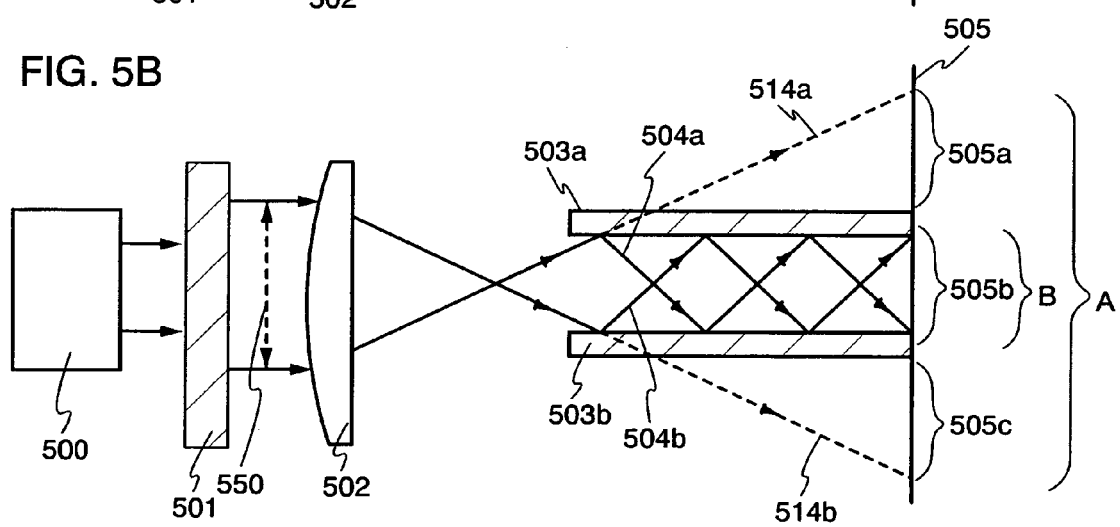
Figure 5C:
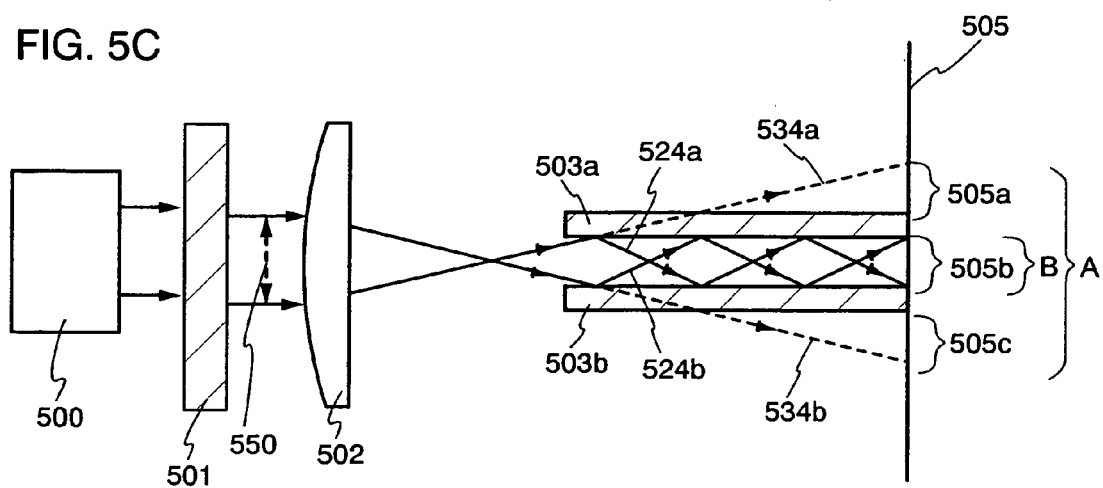

In this embodiment mode, an optical system of a light irradiation apparatus is explained with reference to FIGS. 5A to 5C, in which a light source, a zoom lens, a convex spherical lens, a rectangular optical element disclosed in the present invention described above, and an irradiated surface are arranged. FIG. 5A is a plan view of an optical system according to this embodiment mode, and FIG. 5B is a cross-sectional view of FIG. 5A. FIG. 5C is a cross-sectional view showing a state after the size of an entrance and an exit of the optical element is changed by moving reflectors. The side views of this embodiment mode are the same as the plan views shown in FIGS. 5A to 5C; therefore, the side views are omitted here.

In FIGS. 5A to 5C, a beam propagates in a direction indicated by an arrow. In FIGS. 5A to 5C, a beam emitted from a light source 500 is converged by a convex spherical lens 502 after a beam diameter 550 is adjusted by a zoom lens 501 to enter an optical element 503. The zoom lens is acceptable as long as a lens for achieving a zoom function is employed. For example, a zoom function may be achieved by combining a concave lens and a convex lens and changing the distance between the concave lens and the convex lens.

In FIG. 5B, a beam 504a and a beam 504b at the time that the optical element 503 exists are indicated by a solid line, and a beam 514a and a beam 514b at the time that the optical element 503 does not exist are indicated by a dashed line. When the optical element 503 does not exist, the beam reaches regions 505a to 505c in an irradiated surface 505 as shown by the dashed lines 514a and 514b. On the other hand, when the optical element 503 exists, the beam is reflected by reflectors 503a and 503b of the optical element 503 and all beams reach a region 505b in the irradiated surface 505 as shown by the beams 504a and 504b. In other words, all beams, which reach the regions 505a and 505c in the irradiated surface 505 when the optical element 503 does not exist, reach the region 505b in the irradiated surface 505 when the optical element 503 exists. Therefore, when a beam enters the optical element 503, the beam is reflected repeatedly in the optical element 503 to reach an exit. That is, the entering beam overlaps on the same position, which is the region 505b in the irradiated surface 505, so as to be folded.

In this embodiment mode, when a total length of light spread 505a to 505c on the irradiated surface 505 in the case where the optical element 503 does not exist is indicated by A and a length of light spread 505b on the irradiated surface 505 in the case where the optical element 503 exists is indicated by B, (A/B) corresponds to the division number of a beam entering the optical element 503. In this embodiment mode, the beam diameter 550 of the entering beam is adjusted by arranging a zoom lens 501 so that (A/B) corresponding to the division number of the beam entering the optical element 503 becomes an integer number; therefore, it is possible to make the divided beams overlap completely on the same position to homogenize intensity distribution of the beam. More preferably, (A/B) corresponding to the division number of the beam entering the optical element 503 may be an odd integer number. It is to be noted that, although the description is omitted here, intensity distribution of a beam is homogenized also on the side surface in the same manner because the optical element 503 in this embodiment mode has a rectangular shape.

Further, FIG. 5C shows a case of changing the size of the entrance and the exit by moving reflectors 503a and 503b of an optical element 503. In FIG. 5C, a beam 524a and a beam 524b at the time that the optical element 503 exists are indicated by a solid line, and a beam 534a and a beam 534b at the time that the optical element 503 does not exist are indicated by a dashed line. Even in the case where the size of the entrance and the exit is made to be small by moving the reflectors 503a and 503b as shown in FIG. 5C, a beam diameter 550 of a beam entering the optical element 503 can be adjusted by a zoom lens 501 so that (A/B) corresponding to the division number of the beam entering the optical element 503 is an integer number. As a result, in spite of the beam diameter of a beam emitted from a light source 500, in the exit of the optical element 503, the intensity distribution of the beam can be homogenized by making the divided beams overlap completely.

The beam which enters the convex spherical lens 502 is not necessary to enter symmetrically with respect to an axis of the convex spherical lens 502, and it is acceptable as long as the beam enters the optical element 503 so that (A/B) corresponding to the division number of a beam entering the optical element 503 is an integer number.

In this embodiment mode, a case is explained, where a light source, a zoom lens, a convex spherical lens, an optical element, and an irradiated surface are arranged; however, the invention is not limited to the above structure. For example, a structure in which a plurality of convex spherical lenses are arranged may be employed, or a structure in which a convex spherical lens is arranged between an optical element and an irradiated surface may be employed. In addition, a plurality of lenses may be combined to serve as a convex spherical lens.

Embodiment Mode 5

In this embodiment mode, an optical system in the case where a light irradiation apparatus having an optical element according to the present invention is an exposure apparatus will be explained with reference to FIGS. 6A and 6B.

The exposure apparatus which will be explained in this embodiment mode has a structure in which an elliptical mirror, a light source, an optical element disclosed in the present invention described above, and a convex spherical lens between the light source and the optical element and between the optical element and an irradiated surface, respectively, are arranged. In this embodiment mode, a case of using a halogen lamp as the light source will be explained; however, in the case of using a laser oscillator as the light source, the elliptical mirror is not necessary to be arranged. In addition, as the light source, a xenon lamp, a high pressure mercury lamp, or the like may be used.

In FIGS. 6A and 6B, a beam propagates in a direction indicated by an arrow. In FIGS. 6A and 6B, an elliptical mirror 601 is arranged in the opposite side of an irradiated surface 605 with respect to a light source 602 to converge the beam because a beam emitted from the light source 602 is scattered in all directions. The beam converged by the elliptical mirror 601 enters an optical element 603 according to the invention. The optical element 603 is formed by a plurality of reflectors so that the entrance and the exit have a polygonal shape as explained in Embodiment Mode 1 or 2. Therefore, the beam is reflected in the optical element so as to go from all directions toward inside, and is reformed into a polygonal beam with homogenized intensity distribution in the entrance of the optical element 603. Then, the beam emitted from the optical element 603 is transferred to the irradiated surface by a convex spherical lens 604 to form a beam spot with homogeneous energy distribution on the irradiated surface 605.

By using the optical element according to the invention, the size of the beam spot on the irradiated surface can be easily changed in accordance with the size of a region which is desired to be exposed to light. For example, in the case of exposing a region of 6 mm square to light after a region of 10 mm square is exposed to light, the size of the entrance and the exit is changed to make the beam size small in accordance with the region of 6 mm square. The energy of the beam increases when the beam size is made to be small; therefore, scan speed can be enhanced, and light-exposure which gives the same energy as light-exposure of the region of 10 mm square can be conducted for a short period of time, and thus, throughput is improved. Alternatively, when the region which is desired to be exposed to light is made to be large, the beam size may be made to be large by changing the size of the entrance and the exit. The energy of the beam is lowered when the beam size is made to be large; however, there is no obvious problem because it can be handled by slowing down the scan speed.

In this embodiment mode, a case of arranging the elliptical mirror 601 to converge the beam emitted from the light source 602 is explained; however, the invention is not limited to the above structure. For example, a structure in which a parabolic mirror is arranged instead of the elliptical mirror may be employed. However, in the case of using the parabolic mirror, a structure in which a convex spherical lens is arranged between the light source and the optical element is employed in order to make the beam enter the optical element after the beam is converged because the beam reflected by the parabolic mirror becomes parallel light.

Further, a case is explained in this embodiment mode, in which the elliptical mirror, the light source, the optical element, and the convex spherical lens between the light source and the optical element and between the optical element and an irradiated surface, respectively, are arranged; however, the invention is not limited to the above structure. For example, a structure in which a plurality of convex spherical lenses are arranged may be employed, or a structure in which a convex spherical lens is arranged only between the light source and the optical element or between the optical element and the irradiated surface may be employed. In addition, a plurality of lenses may be combined to serve as a convex spherical lens. Specifically, a meniscus lens, a double convex lens, and a meniscus lens can serve as a convex spherical lens by being combined in this order.

Embodiment Mode 6

In this embodiment mode, the manufacturing of a crystalline semiconductor film using a laser irradiation apparatus up to be a semiconductor device in the case where a light irradiation apparatus according to the present invention is a laser irradiation apparatus will be explained with reference to FIGS. 7A to 7D, FIGS. 8A to 8D, and FIGS. 9A and 9B.

Figure 7A:
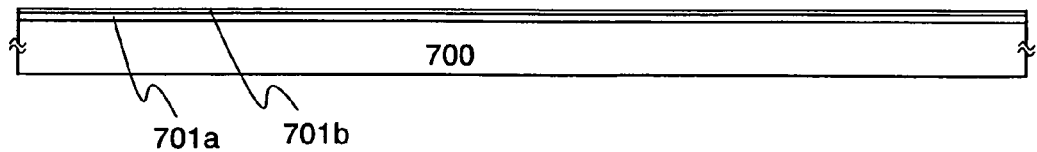
FIGS. 7A to 7D are views showing a method for manufacturing a semiconductor device according to the invention.

First, as shown in FIG. 7A, base insulating films 701a and 701b are formed over a substrate 700. As the material for the substrate 700, an insulating substrate such as a glass substrate, a quartz substrate, or a crystalline glass substrate can be used. Besides, a ceramic substrate, a stainless steel substrate, a metal substrate (tantalum, tungsten, molybdenum, or the like), a semiconductor substrate, a plastic substrate (polyimide, acrylic, polyethylene terephthalate, polycarbonate, polyarylate, polyethersulfone, or the like), or the like can be used. As the substrate 700, a material capable of withstanding at least heat generated during a process may be used. A glass substrate is used in this embodiment mode.

A silicon oxide film, a silicon nitride film, a silicon oxynitride film, or the like can be used as the base insulating films 701a and 701b, and these insulating films are formed to be a single layer or a plurality of layers including two or more layers. These insulating films are formed by a known method such as a sputtering method, a low pressure CVD method, or a plasma CVD method. The base insulating film is formed to have a laminated structure including two layers in this embodiment mode. However, of course, the base insulating film may be a single layer or a plurality of layers including three layers or more. In this embodiment mode, a silicon nitride oxide film is formed to be 50 nm in thick as the base insulating film 701a of a first layer, and a silicon oxynitride film is formed to be 100 nm in thick as the base insulating film 701b of a second layer. It is to be noted that the silicon nitride oxide film and the silicon oxynitride film indicate that a proportion of nitrogen to oxygen is different, and indicate that the former has higher content of nitrogen.

Then, an amorphous semiconductor film 702 is formed. The amorphous semiconductor film 702 may be made of silicon or a material containing silicon as its main component (for example, $Si_xGe_{1-x}$ or the like) in 25 to 80 nm thick. As a manufacturing method, a known method such as a sputtering method, a low pressure CVD method, or a plasma CVD method can be used. In this embodiment mode, the amorphous semiconductor film 702 is made of amorphous silicon in 66 nm thick.

Subsequently, crystallization of the amorphous semiconductor film 702 is conducted. In this embodiment mode, a step of crystallization by laser annealing will be explained.

A laser irradiation apparatus according to the invention is used for the laser annealing. As a laser oscillator of a light source, an excimer laser, a YAG laser, a glass laser, a $YVO_4$ laser, a YLF laser, an Ar laser, or the like may be used.

Figure 7B:
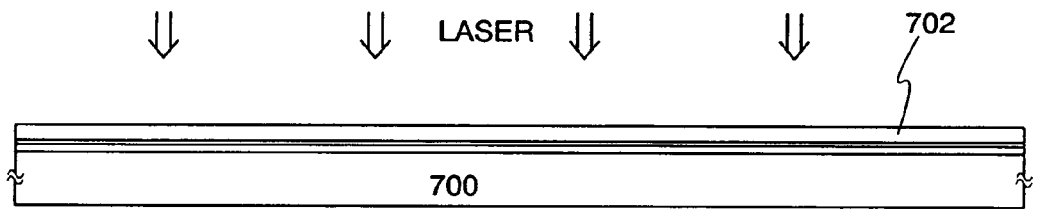

The laser annealing is conducted as shown in FIG. 7B using the laser irradiation apparatus according to the invention to crystallize the amorphous semiconductor film 702. More specifically, the crystallization may be conducted using the light irradiation apparatus and the optical element mentioned in Embodiment Modes 1 to 5. For example, the laser annealing may be conducted under the conditions where energy density is 200 $mJ/cm^2$ to 1,000 $mJ/cm^2$ and the number of shots is 1 shot to 10 shots, preferably, 3 shots. A beam with a desired size can be formed in accordance with a region to be irradiated by the laser irradiation apparatus according to the invention; therefore, a beam is adjusted to an appropriate energy density by lowering voltage which is to be applied to the laser oscillator of the light source when the area of the region to be irradiated is small and the energy density is excessive. By this, burden to the laser oscillator can be reduced; therefore, a lifetime of the laser oscillator can be expected to be extended. In the case where the laser oscillator is a gas laser, a lifetime of gas used for laser oscillation can be also extended.

Figure 7C:
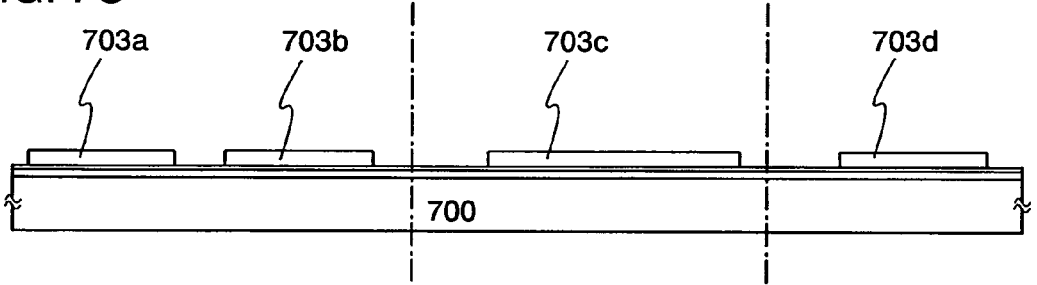
Figure 7D:
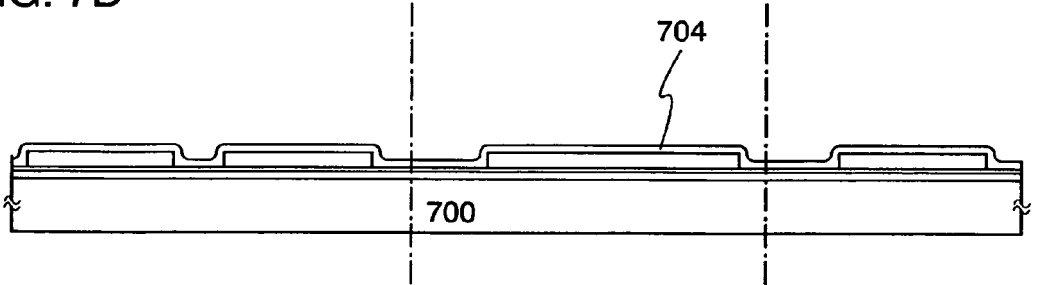

Then, as shown in FIG. 7C, the crystallized amorphous semiconductor film 702 is etched to form island-like crystalline semiconductor films 703a to 703d having a desired shape. Subsequently, a gate insulating film 704 is formed. An insulating film containing silicon may be formed to have a film thickness of approximately 115 nm by a low pressure CVD method, a plasma CVD method, a sputtering method, or the like. A silicon oxide film is formed in this embodiment mode. In this case, the silicon oxide film is formed by a plasma CVD method with the mixture of TEOS (Tetraethyl Ortho Silicate) and $O_2$ under the conditions where a reaction pressure is at 40 Pa, a substrate temperature is at 300° C. to 400° C., and a high frequency (13.56 MHz) power density is 0.5 $W/cm^2$ to 0.8 $W/cm^2$ to be discharged. The silicon oxide film formed in this manner can provide favorable characteristics as the gate insulating film by heat treatment at temperatures from 400° C. to 500° C., subsequently.

By crystallizing a semiconductor film using the laser irradiation apparatus according to the invention, inhomogeneity of crystallinity due to inhomogeneity of intensity distribution of a laser beam can be suppressed, and a crystalline semiconductor film with favorable and homogeneous characteristics can be obtained.

Subsequently, a tantalum nitride (TaN) film of 30 nm in thickness is formed as a first conductive film over the gate insulating film 704 and a tungsten (W) film of 370 nm in thickness is formed as a second conductive film over the first conductive film. Both of the TaN film and the W film may be formed by a sputtering method. The TaN film may be formed in a nitrogen atmosphere by using Ta as a target, and the W film may be formed by using W as a target. It is necessary to have low resistance in order to be used as a gate electrode, and in particular, the resistivity of the W film is desirably 20 μΩcm or less. Therefore, high purity (99.99 wt %) target of W is desirably used and further attention has to be paid not to let impurities in during film formation. The resistivity of the W film formed like this can be from 9 μΩcm to 20 μΩcm.

It is to be noted that the first conductive film is the TaN film of 30 nm in thickness and the second conductive film is the W film of 370 nm in thickness in this embodiment mode; however, the invention is not limited thereto. For example, the first conductive film and the second conductive film may be made of any element of Ta, W, Ti, Mo, Al, Cu, Cr, and Nd, or an alloy material or a compound material containing the element as its main component. Furthermore, a semiconductor film typified by a polycrystalline silicon film doped with an impurity element such as phosphorus may be used. An AgPdCu alloy may be used as well. A combination thereof may be selected appropriately. The film thickness of the first conductive film may be in the range of 20 nm and 100 nm, and the film thickness of the second conductive film may be 100 nm to 400 nm. In this embodiment mode, a laminated structure including two layers is employed; however, a single layer structure or a laminated structure including three layers or more may be employed.

In order to form an electrode and a wiring by etching the first conductive film and the second conductive film, a mask 731 made of resist is formed through a light-exposure step by photolithography. First etching is conducted under first and second etching conditions. A gate electrode and a wiring are formed by etching the first conductive film and the second conductive film using the mask 731. The etching condition may be selected appropriately.

In the first etching, ICP (Inductively Coupled Plasma) etching is employed. As the first etching conditions, $CF_4$, $Cl_2$, and $O_2$ are used as an etching gas with the gas-flow ratio of 25:25:10 (sccm), respectively, and at a pressure of 1.0 Pa, an RF (13.56 MHz) power of 500 W is applied to a coil electrode and plasma is generated to conduct etching. An RF (13.56 MHz) power of 150 W is applied to a substrate (sample stage) side and a substantially negative self-bias voltage is applied. The W film is etched under the first etching conditions to make the edge portions of the first conductive film have a tapered shape. The etching rate with respect to the W film under the first etching conditions is 200 nm/min, the etching rate with respect to the TaN film is 80 nm/min, and the selectivity ratio of the W film to the TaN film is approximately 2.5. Further, the taper angle of the W film is made to be approximately 26° under the first etching conditions.

Subsequently, etching is conducted under the second etching conditions. Etching is conducted for about 15 seconds with the mask 731 left, by using $CF_4$ and $Cl_2$ as an etching gas with the gas-flow ratio of 30:30 (sccm), and at a pressure of 1.0 Pa, an RF (13.56 MHz) power of 500 W is applied to the coil electrode and plasma is generated. An RF (13.56 MHz) power of 20 W is applied to a substrate (sample stage) side to apply a substantially negative self-bias voltage. The W film and the TaN film are etched to the same level under the second etching conditions mixing $CF_4$ and $Cl_2$.

The etching rate with respect to the W film is 59 nm/min and the etching rate with respect to the TaN film is 66 nm/min under the second etching conditions. In order to conduct etching without leaving a residue on the gate insulating film 704, etching time may be increased at the rate of approximately 10% to 20%. In the first etching, the gate insulating film 704 which is not covered with the electrode is etched to approximately 20 nm to 50 nm.

The edge portions of the first conductive film and the second conductive film become tapered in the first etching due to the bias voltage applied to the substrate side.

Figure 8A:
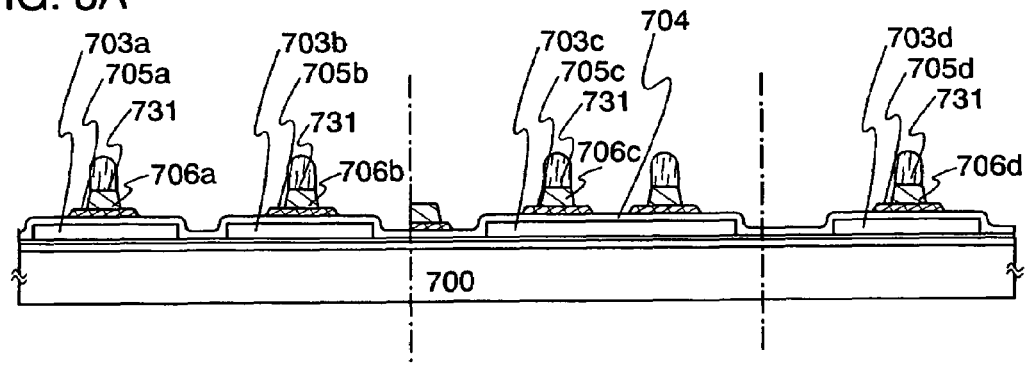
FIGS. 8A to 8D are views showing a method for manufacturing a semiconductor device according to the invention.

Then, second etching is conducted without removing the mask 731. The second etching is conducted for about 25 seconds using $SF_6$, $Cl_2$, and $O_2$ as an etching gas with the gas-flow ratio of 24:12:24 (sccm), and at a pressure of 1.3 Pa, an RF (13.56 MHz) power of 700 W is applied to the coil electrode and plasma is generated. An RF (13.56 MHz) power of 10 W is applied to a substrate (sample stage) side to apply a substantially negative self-bias voltage. The W film is selectively etched under these etching conditions. At this time, the first conductive film is hardly etched. By the first and second etching, gate electrodes made of the first conductive layers 705a to 705d and the second conductive layers 706a to 706d are formed as shown in FIG. 8A.

Figure 8B:
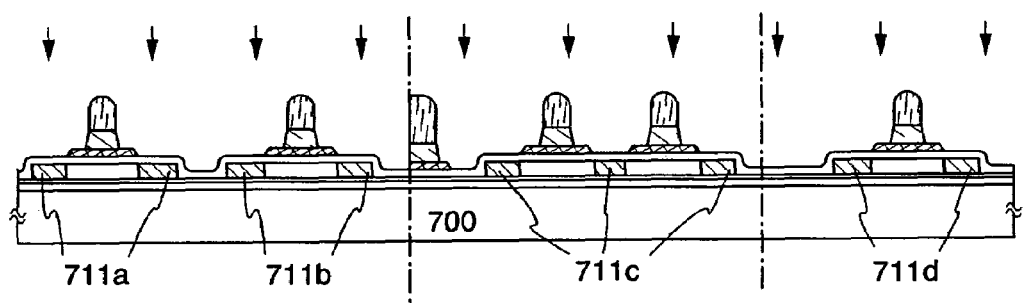

Subsequently, first doping is conducted without removing the mask 731 as shown in FIG. 8B. Thus, an impurity which imparts n-type is added to the island-like crystalline semiconductor films 703a to 703d at a low concentration. The first doping may be conducted by ion doping or ion implantation. The ion doping may be conducted under the conditions where the dosage is $1\times10^{13}$ ions/cm² to $5\times10^{14}$ ions/cm², and an acceleration voltage is 40 kV to 80 kV. The ion doping is conducted at an acceleration voltage of 50 kV in this embodiment mode. As an impurity element which imparts n-type, an element belonging to the Group 15 in the periodic table typified by phosphorus (P) or arsenic (As) can be used. Phosphorus (P) is used in this embodiment mode. The first conductive layers 705a to 705d are used as masks to form pairs of first impurity regions (n⁻⁻ region) 711a to 711d to which an impurity of low concentration is added, in a self-aligned manner.

Figure 8C:
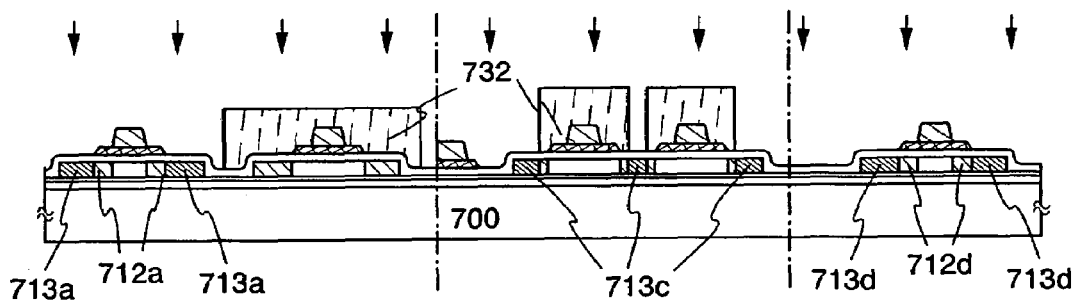

Subsequently, the mask 731 is removed. Then, a mask 732 made of resist is newly formed to conduct second doping as shown in FIG. 8C at a higher acceleration voltage than the first doping. An impurity which imparts n-type is added in the second doping as well. The ion doping may be conducted under the conditions where the dosage is $1\times10^{13}$ ions/cm² to $3\times10^{15}$ ions/cm², and an acceleration voltage is 60 kV to 120 kV. The ion doping is conducted with the dosage of $3.0\times10^{15}$ ions/cm² at an acceleration voltage of 65 kV in this embodiment mode. The second doping is conducted so that an impurity element is also added into the semiconductor film below the first conductive layers 705a and 705d by using the mask 732 and the second conductive layers 706a and 706d which are not covered with the mask 732 as masks against the impurity element.

By the second doping, pairs of second impurity regions (n⁻ region) 712a and 712d are formed in a portion which is not covered with the mask 732 and is not overlapped with the second conductive layers 706a to 706d, of a portion where the crystalline semiconductor films 703a to 703d are overlapped with the first conductive layers 705a to 705d. An impurity which imparts n-type is added into the second impurity regions at the concentration ranging from $1\times10^{18}$ atoms/cm³ to $5\times10^{19}$ atoms/cm³. Further, an impurity which imparts n-type is added at a high concentration ranging from $1\times10^{19}$ atoms/cm³ to $5\times10^{21}$ atoms/cm³ into an exposed portion which are covered with neither the first conductive layers 705a to 705d nor the mask 732, of the crystalline semiconductor films 703a to 703d, and accordingly, pairs of third impurity regions (n⁺ region) 713a, 713c, and 713d are formed. In addition, in a portion which is covered with the mask 732 and is not overlapped with the first conductive layers 705b and 705c, of the crystalline semiconductor films 703b and 703c, the first impurity regions remain with the impurity at the low concentration added in the first doping; therefore, the portion is continuously referred to as the first impurity region (n⁻⁻ region).

Note that each impurity region is formed by two doping processes in this embodiment mode; however, the invention is not limited thereto. Therefore, the impurity region having a desired impurity concentration may be formed by one or multiple doping processes while the condition is determined appropriately.

Figure 8D:
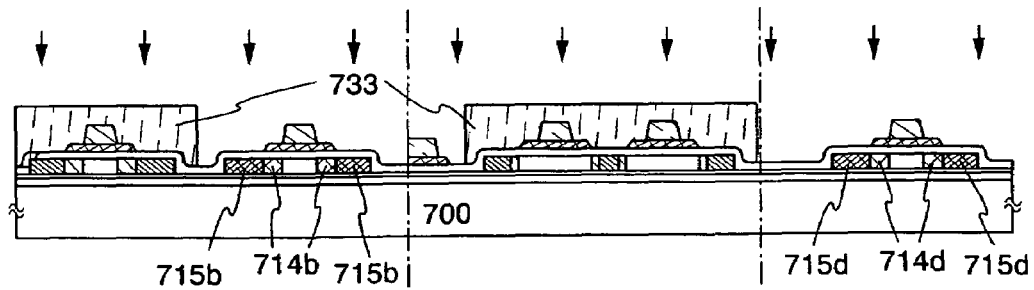

Subsequently, the mask 732 is removed and a mask 733 made of resist is newly formed to conduct third doping as shown in FIG. 8D. By the third doping, pairs of fourth impurity regions (p⁻ region) 714b and 714d and pairs of fifth impurity regions (p⁺ region) 715b and 715d, where an impurity element which imparts the opposite conductivity to the first conductivity and the second conductivity is added to the semiconductor film to be a p-channel transistor, are formed.

In the third doping, the fourth impurity regions (p⁻ region) 714b and 714d are formed in a portion which are not covered with the mask 733, are overlapped with the first conductive layer, and are not overlapped with the second conductive layer. Further, the fifth impurity regions (p⁺ region) 715b and 715d are formed in a portion which are not covered with the mask 733 and are not overlapped with the first conductive layers 705b and 705d. As the impurity element which imparts p-type, an element belonging to the Group 13 in the periodic table, such as boron (B), aluminum (Al), or gallium (Ga), is known.

In this embodiment mode, boron (B) is selected as the p-type impurity element which forms the fourth impurity regions 714b and 714d and the fifth impurity regions 715b and 715d by ion doping using diborane ($B_2H_6$). Ion doping is conducted under the conditions where the dosage is $1\times10^{16}$ ions/cm² and an acceleration voltage is 80 kV.

In the third doping, the semiconductor film to be an n-channel TFT is covered with the mask 733.

Here, phosphorus is added to the fourth impurity regions (p⁻ region) 714b and 714d and the fifth impurity regions (p⁺ region) 715b and 715d at different concentrations, respectively, by the first and second doping. However, in all of the fourth impurity regions (p⁻ region) 714b and 714d and the fifth impurity regions (p⁺ region) 715b and 715d, the third doping is conducted so that the concentration of the impurity element which imparts p-type is $1\times10^{19}$ atoms/cm³ to $5\times10^{21}$ atoms/cm³. Therefore, the fourth impurity regions (p⁻ region) 714b and 714d and the fifth impurity regions (p⁺ region) 715b and 715d serve as source regions and drain regions of p-channel TFTs without problems.

In this embodiment mode, the fourth impurity regions (p⁻ region) 714b and 714d and the fifth impurity regions (p⁺ region) 715b and 715d are formed at one time by the third doping; however, the invention is not limited thereto. The fourth impurity regions (p⁻ region) 714b and 714d and the fifth impurity regions (p⁺ region) 715b and 715d may be formed appropriately by multiple doping processes depending on the doping condition.

By these doping processes, the first impurity region (n⁻⁻ region) 711c, the second impurity region (n⁻ region) 712a, the third impurity regions (n⁺ region) 713a and 713c, the fourth impurity regions (p⁻ region) 714b and 714d, and the fifth impurity regions (p⁺ region) 715b and 715d are formed.

Figure 9A:
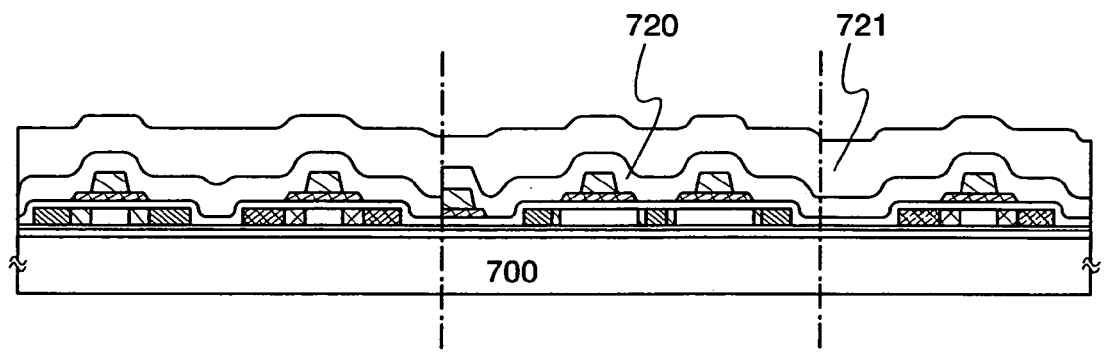
FIGS. 9A and 9B are views showing a method for manufacturing a semiconductor device according to the invention.

Next, the mask 733 is removed to form a first passivation film 720 as shown in FIG. 9A. As the first passivation film 720, an insulating film containing silicon is formed to have a thickness of from 100 nm to 200 nm by a plasma CVD method or a sputtering method. In this embodiment mode, a silicon oxynitride film is formed in 100 nm thick by a plasma CVD method. In the case of using a silicon oxynitride film, a silicon oxynitride film made of $SiH_4$, $N_2O$, and $NH_3$ or a silicon oxynitride silicon film made of $SiH_4$ and $N_2O$, formed by a plasma CVD method, may be used. In this case, the film is formed under the conditions where a reaction pressure is 20 Pa to 200 Pa, a substrate temperature is 300° C. to 400° C., and a high frequency (60 MHz) power density is 0.1 W/cm$^2$ to 1.0 W/cm$^2$. Further, a silicon oxynitride hydride film made of $SiH_4$, $N_2O$, and $H_2$ may be employed as the first passivation film 720. It is needless to say that the first passivation film 720 is not limited to a single layer structure of the silicon oxynitride film as in this embodiment mode, but another insulating film containing silicon having a single layer structure or a laminated structure may be employed.

Thereafter, crystallinity of the semiconductor film is recovered and the impurity element added into the semiconductor film is activated by laser annealing using the laser irradiation apparatus according to the invention. For example, the laser annealing may be conducted under the conditions where energy density is 100 mJ/cm$^2$ to 1,000 mJ/cm$^2$, and the number of shots is 1 shot to 10 shots, preferably, 3 shots. Note that heat treatment or rapid thermal annealing (RTA) can be employed instead of laser annealing.

By conducting heat treatment after the first passivation film 720 is formed, the semiconductor film can be hydrogenated as well as activated. Hydrogenation is a method by which a dangling bond in the semiconductor film is terminated by hydrogen in the first passivation film 720.

A heat treatment may be conducted before the first passivation film 720 is formed. However, in the case where materials which form the first conductive layers 705a to 705d and the second conductive layers 706a to 706d are sensitive to heat, it is preferable to conduct heat treatment after the first passivation film 720 is formed in order to protect a wiring and the like, as in this embodiment mode. Further, in the case of conducting the heat treatment before the first passivation film 720 is formed, hydrogenation by using hydrogen in the first passivation film 720 cannot be obviously conducted because the first passivation film 720 is not formed yet.

In this case, hydrogenation may be conducted by using hydrogen excited by plasma (plasma hydrogenation) or by heating treatment at temperatures from 300° C. to 450° C. for 1 to 12 hours in an atmosphere containing hydrogen of 3 wt % to 100 wt %.

Subsequently, a first interlayer insulating film 721 is formed on the first passivation film 720. The first interlayer insulating film 721 may be an inorganic insulating film or an organic insulating film. The inorganic insulating film can be a silicon oxide film formed by a CVD method, a silicon oxide film applied by a SOG (Spin On Glass) method, or the like. The organic insulating film may be a film of polyimide, polyamide, BCB (benzocyclobutene), acrylic, or a positive photosensitive organic resin, a negative photosensitive organic resin, or the like. Also, a laminated structure of an acrylic film and a silicon oxynitride film may be used.

The interlayer insulating film can be made of a material including a skeleton structure formed by the bond of silicon (Si) and oxygen (O), in which an organic group containing at least hydrogen (such as an alkyl group or aromatic hydrocarbon) is included as a substituent. Alternatively, a material in which a fluoro group is included as the substituent may be used. Further alternatively, a material in which a fluoro group and an organic group containing at least hydrogen are included as the substituent may be used. As a typical example of these materials, siloxane-based polymer is given.

The siloxane-based polymer can be classified into, for example, silica glass, alkyl siloxane polymer, alkyl silsesquioxane polymer, hydrogenated silsesquioxane polymer, hydrogenated alkyl silsesquioxane polymer, and the like depending on its structure.

Further, the interlayer insulating film may be formed using a material containing polymer (polysilazane) with a Si—N bond.

By using the above-mentioned materials, an interlayer insulating film having a sufficient insulating property and flatness can be obtained even if it has a thin film thickness. Also, since the above-mentioned materials have high heat resistance, an interlayer insulating film capable of withstanding a reflow treatment which is conducted for a multilayer wiring can be obtained. Furthermore, these materials have low hygroscopic properties; therefore, an interlayer insulating film with a small amount of dehydration can be formed.

In this embodiment mode, a non-photosensitive acrylic film having a film thickness of 1.6 μm is formed. By the first interlayer insulating film 721, depressions and projections due to the TFT formed on the substrate can be relaxed and flattened. Since the first interlayer insulating film 721 is provided particularly for the purpose of flattening, it is preferable to use an insulating film made of a material easy to be flattened.

Subsequently, a second passivation film made of a silicon nitride oxide film or the like may be formed on the first interlayer insulating film 721. The film thickness of the second passivation film may be approximately from 10 nm to 200 nm, and the second passivation film can suppress moisture to be moved in and out of the first interlayer insulating film 721. In addition, as the second passivation film, a silicon nitride film, an aluminum nitride film, an aluminum oxynitride film, a diamond-like carbon (DLC) film, or a carbon nitride (CN) film can be similarly used. As a film formation method, a plasma CVD method or a sputtering method may be used; however, when an RF sputtering method is used, a highly dense film which is superior in the barrier properties is obtained. In the case of forming, for example, a silicon oxynitride film, the RF sputtering is conducted under the conditions where Si is used as a target, $N_2$, Ar, and $N_2O$ are flowed with the gas-flow ratio of 31:5:4, the pressure is set to 0.4 Pa, and the power is set to 3,000 W. Alternatively, in the case of forming, for example, a silicon nitride film, Si is used as a target, $N_2$ an Ar in the chamber are flowed with the gas-flow ratio of 1:1, the pressure is 0.8 Pa, the power is 3,000 W, and the film-forming temperature is 215° C.

Then, the first passivation film 720 and the first interlayer insulating film 721 are etched. And then, contact holes to reach the third impurity regions 713a and 713c and the fifth impurity regions 715b and 715d are formed.

Figure 9B:
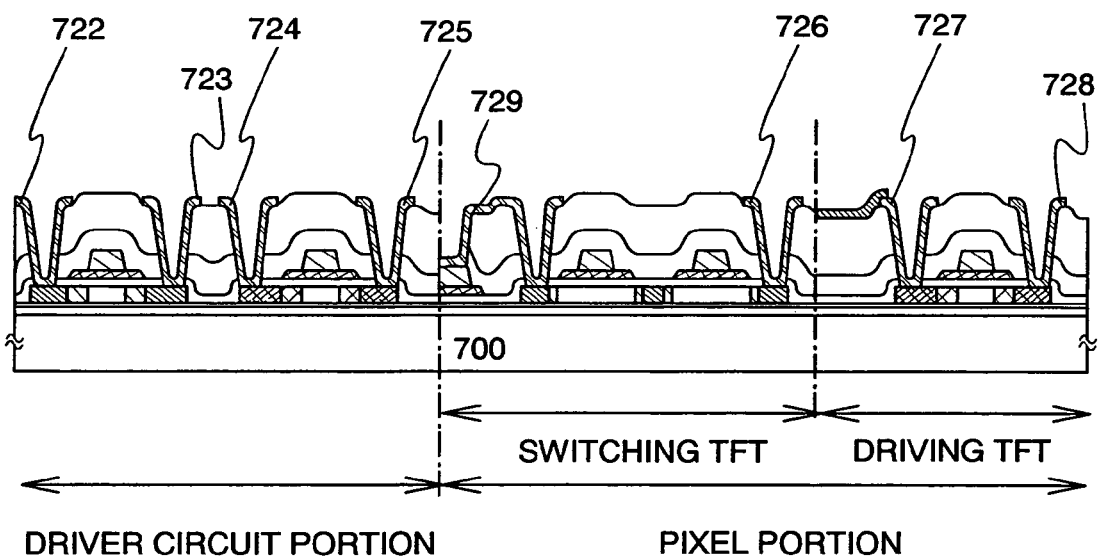

Subsequently, as shown in FIG. 9B, wirings 722 to 729 which are electrically connected to each impurity region are formed. It is to be noted that these wirings 722 to 729 are formed by a laminated film of a Ti film having a film thickness of 50 nm and an alloy film (Al and Ti) having a film thickness of 500 nm. It is needless to say that the invention is not limited to a two-layer structure, and a single layer structure or a laminated structure including three or more layers may be employed. Further, the material for the wirings is not limited to Al and Ti. For example, a laminated film in which an Al film or a Cu film is formed on a TaN film, and then, a Ti film is formed thereon may be used to form the wirings.

Embodiment Mode 7

Various electronic devices can be manufactured using a light irradiation apparatus shown in Embodiment Modes 1 to 5. As an example of an electronic device which is to be manufactured, a television set, a camera such as a video camera or a digital camera, a goggle type display (head mounted display), a navigation system, a sound reproducing device (a car audio equipment, an audio component, or the like), and the like are given. In addition, a personal computer, a game machine, a portable information terminal (a mobile computer, a mobile phone, a portable game machine, an electronic book, or the like), an image reproducing device provided with a recording medium (typically, a device provided with a display which can reproduce a recording medium such as a digital versatile disc (DVD) and display the image), and the like are given. Specific examples of these electronic devices are shown in FIGS. 10A to 10H.

Figure 10A:
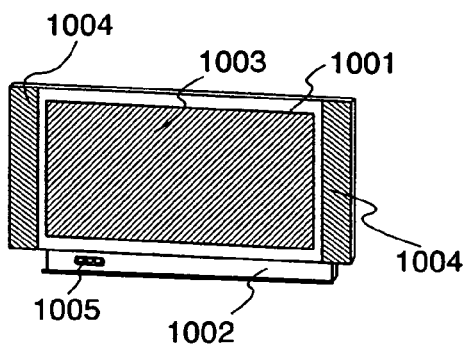
FIGS. 10A to 10H are views each showing an electronic device incorporating a semiconductor device manufactured by a manufacturing method of a semiconductor device according to the invention.

FIG. 10A shows a television set, which includes a chassis 1001, a support 1002, a display portion 1003, a speaker portion 1004, a video input terminal 1005, and the like. The light irradiation apparatus shown in Embodiment Modes 1 to 5 can be applied to the manufacturing of the display portion 1003 or the like to complete the television set. A display device such as an EL display or a liquid crystal display can be used as the display portion 1003. It is to be noted that the television set includes all television sets such as the ones for a computer, TV broadcast reception, and advertisement display.

Figure 10B:
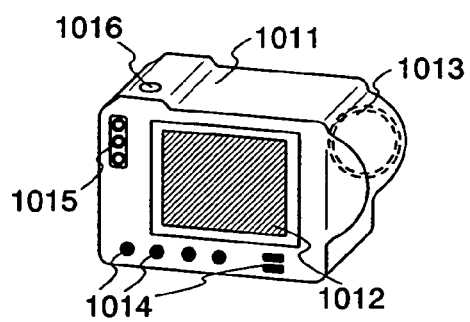

FIG. 10B shows a digital camera, which includes a main body 1011, a display portion 1012, an image receiving portion 1013, operating keys 1014, an external connecting port 1015, a shutter 1016, and the like. The light irradiation apparatus shown in Embodiment Modes 1 to 5 can be applied to the manufacturing of the display portion 1012 and the like to complete the digital camera.

Figure 10C:
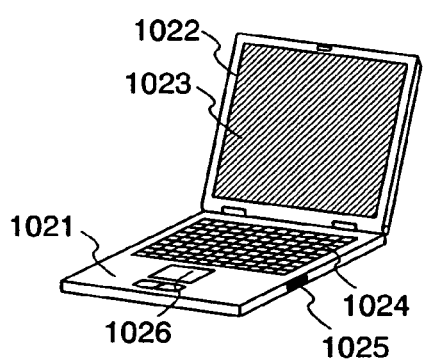

FIG. 10C shows a computer, which includes a main body 1021, a chassis 1022, a display portion 1023, a keyboard 1024, an external connecting port 1025, a pointing mouse 1026, and the like. The light irradiation apparatus shown in Embodiment Modes 1 to 5 can be applied to the manufacturing of the display portion 1023 and the like to complete the computer.

Figure 10D:
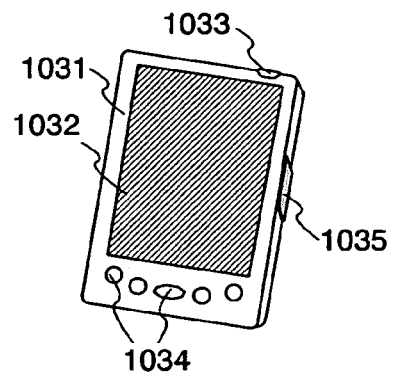

FIG. 10D shows a mobile computer, which includes a main body 1031, a display portion 1032, a switch 1033, operating keys 1034, an infrared port 1035, and the like. The light irradiation apparatus shown in Embodiment Modes 1 to 5 can be applied to the manufacturing of the display portion 1032 and the like to complete the mobile computer.

Figure 10E:
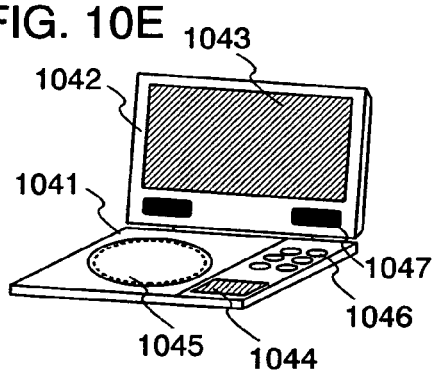

FIG. 10E shows an image reproducing device provided with a recording medium (specifically, a DVD reproducing device), which includes a main body 1041, a chassis 1042, a display portion A 1043, a display portion B 1044, a recording medium (e.g., DVD) reading portion 1045, an operating key 1046, a speaker portion 1047, and the like. The display portion A 1043 mainly displays image information while the display portion B 1044 mainly displays text information. The light irradiation apparatus shown in Embodiment Modes 1 to 5 can be applied to the manufacturing of the display portion A 1043, the display portion B 1044, and the like to complete the image reproducing device. It is to be noted that the image reproducing device provided with a recording medium includes a game machine and the like.

Figure 10F:
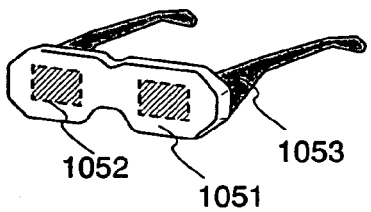

FIG. 10F shows a goggle type display (head mounted display), which includes a main body 1051, a display portion 1052, and an arm portion 1053. The light irradiation apparatus shown in Embodiment Modes 1 to 5 can be applied to the manufacturing of the display portion 1052 and the like to complete the goggle type display.

Figure 10G:
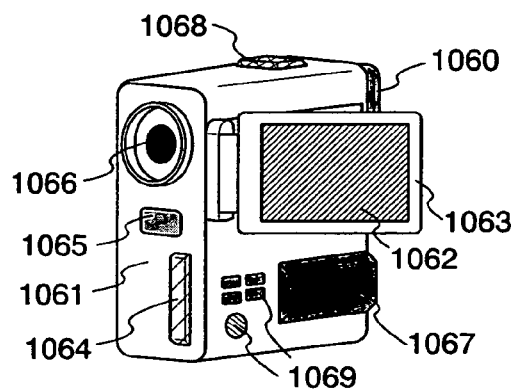

FIG. 10G shows a video camera, which includes a main body 1061, a display portion 1062, a chassis 1063, an external connecting port 1064, a remote controller receiving portion 1065, an image receiving portion 1066, a battery 1067, an audio input portion 1068, operating keys 1069, an eye piece 1060, and the like. The light irradiation apparatus shown in Embodiment Modes 1 to 5 can be applied to the manufacturing of the display portion 1062 and the like to complete the video camera.

Figure 10H:
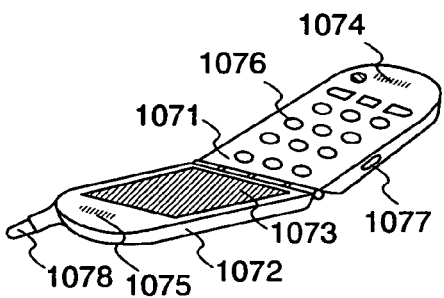
Figure 13A:
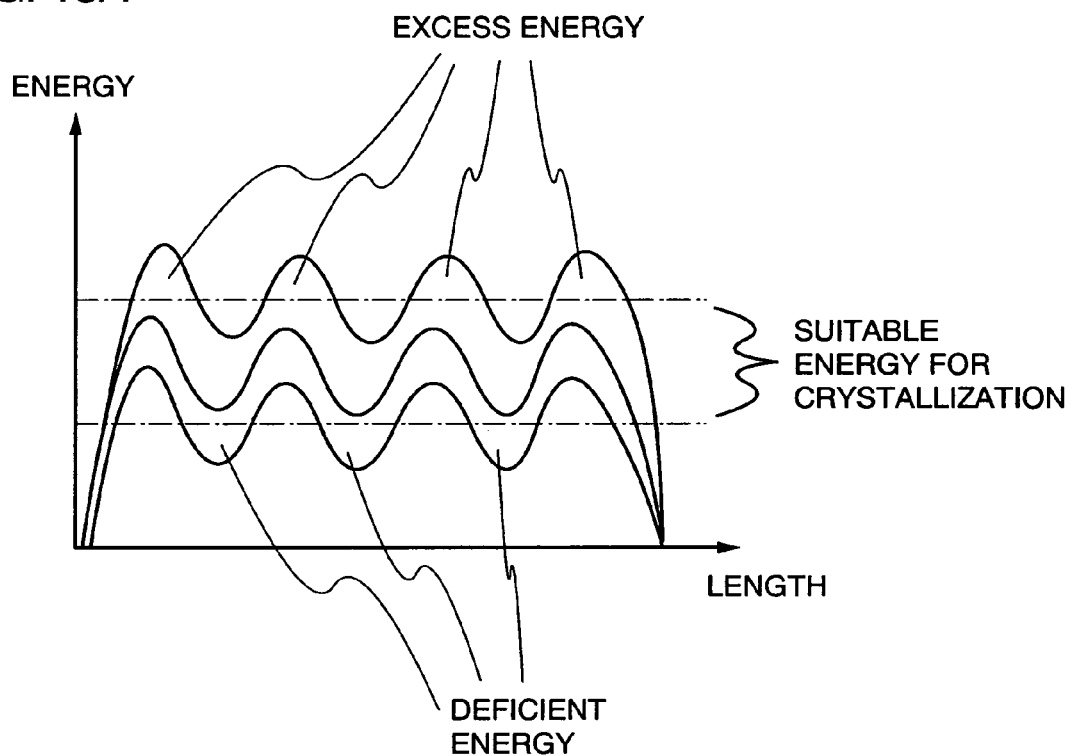
FIGS. 13A and 13B are views showing energy distribution of a beam spot.
Figure 13B:
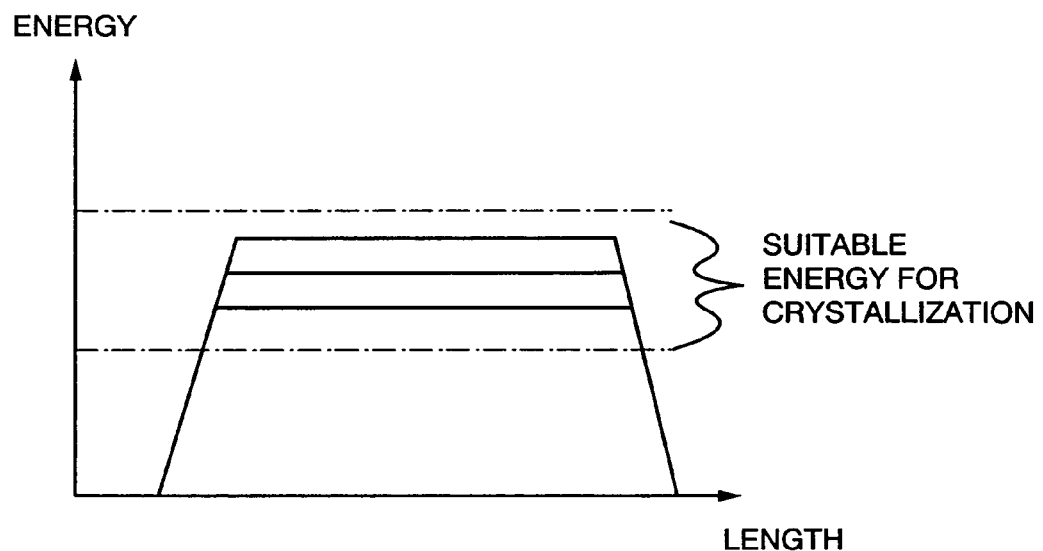

FIG. 10H shows a mobile phone, which includes a main body 1071, a chassis 1072, a display portion 1073, an audio input portion 1074, an audio output portion 1075, an operating key 1076, an external connecting port 1077, an antenna 1078, and the like. The light irradiation apparatus shown in Embodiment Modes 1 to 5 can be applied to the manufacturing of the display portion 1073 and the like to complete the mobile phone. If the display portion 1073 displays white letters on black background, a mobile phone consumes less power.

In particular, the display device used for the display portion of such electronic devices has a TFT for driving a pixel, and the light irradiation apparatus shown in Embodiment Modes 1 to 5 can be used for crystallizing a semiconductor film used for the TFT. Further, when the display device used for the display portion of the electronic device requires high definition and high characteristics as the EL display device, the electronic device having a display portion in which the display unevenness is further reduced can be manufactured by crystallizing a semiconductor film with the use of the light irradiation apparatus shown in Embodiment Modes 1 to 5.

As thus described, the light irradiation apparatus according to the invention can be applied in a wide range and can be used for the manufacturing of the electronic device in every field.

This application is based on Japanese Patent Application serial No. 2005-102316 field in Japan Patent Office on Mar. 31, 2005, the entire contents of which are hereby incorporated by reference.

What is claimed is:

1. An optical element which homogenizes an energy distribution of a beam spot on an irradiation surface, comprising:
    a triangular entrance and exit,
    wherein the triangular entrance and exit comprise at least three reflectors, each of the at least three reflectors is movable relatively to another adjacent reflector.

2. An optical element according to claim 1, wherein a shape of the beam spot on the irradiation surface is equal to a shape of the entrance and the exit.

3. An optical element according to claim 1, wherein a mirror surface processing is conducted to a portion where each of the at least three reflectors is adjacent to the another adjacent reflector.

4. An optical element according to claim 1, wherein a central axis of the entrance and the exit is fixed before and after a movement of the at least three reflectors.

5. An optical element according to claim 1, wherein a beam entering the entrance at $60°<\theta<90°$ is reflected when an incident angle of the beam entering the entrance is indicated by $\theta$.

6. An optical element which homogenizes an energy distribution of a beam spot on an irradiation surface, comprising:
    a pentagonal entrance and exit,
    wherein the pentagonal entrance and exit comprise at least five reflectors, each of the at least five reflectors is movable relatively to another adjacent reflector.

7. An optical element according to claim 6, wherein a shape of the entrance and the exit is a pentagonal shape having a golden ratio.

8. An optical element according to claim 6, wherein a shape of the beam spot on the irradiation surface is equal to a shape of the entrance and the exit.

9. An optical element according to claim 6, wherein a mirror surface processing is conducted to a portion where each of the at least five reflectors is adjacent to the another adjacent reflector.

10. An optical element according to claim 6, wherein a central axis of the entrance and the exit is fixed before and after a movement of the at least five reflectors.

11. An optical element according to claim 6, wherein a beam entering the entrance at $60°<\theta<90°$ is reflected when an incident angle of the beam entering the entrance is indicated by $\theta$.

12. An optical element which homogenizes an energy distribution of a beam spot on an irradiation surface, comprising:
a triangular entrance and exit,
wherein the triangular entrance and exit comprise at least three reflectors, each of the at least three reflectors is movable relatively to another adjacent reflector, and shapes of the triangular entrance and exit have a similarity before and after a movement of the at least three reflectors.

13. An optical element according to claim 12, wherein a shape of the beam spot on the irradiation surface is equal to a shape of the entrance and the exit.

14. An optical element according to claim 12, wherein a mirror surface processing is conducted to a portion where each of the at least three reflectors is adjacent to the another adjacent reflector.

15. An optical element according to claim 12, wherein a central axis of the entrance and the exit is fixed before and after a movement of the at least three reflectors.

16. An optical element according to claim 12, wherein a beam entering the entrance at $60°<\theta<90°$ is reflected when an incident angle of the beam entering the entrance is indicated by $\theta$.

17. An optical element which homogenizes an energy distribution of a beam spot on an irradiation surface, comprising:
a pentagonal entrance and exit,
wherein the pentagonal entrance and exit comprise at least five reflectors, each of the at least five reflectors is movable relatively to another adjacent reflector, and shapes of the pentagonal entrance and exit have a similarity before and after a movement of the at least five reflectors.

18. An optical element according to claim 17, wherein a shape of the entrance and the exit is a pentagonal shape having a golden ratio.

19. An optical element according to claim 17, wherein a shape of the beam spot on the irradiation surface is equal to a shape of the entrance and the exit.

20. An optical element according to claim 17, wherein a mirror surface processing is conducted to a portion where each of the at least five reflectors is adjacent to the another adjacent reflector.

21. An optical element according to claim 17, wherein a central axis of the entrance and the exit is fixed before and after a movement of the at least five reflectors.

22. An optical element according to claim 17, wherein a beam entering the entrance at $60°<\theta<90°$ is reflected when an incident angle of the beam entering the entrance is indicated by $\theta$.

23. A light irradiation apparatus comprising:
a light source;
an optical element having a triangular entrance and exit; and
a spherical lens which transfers a beam having a homogeneous intensity distribution formed by the optical element to an irradiation surface,
wherein the optical element has at least three reflectors which form the triangular entrance and exit, each of the at least three reflectors is movable relatively to another adjacent reflector.

24. A light irradiation apparatus according to claim 23, wherein a beam spot having a shape of the entrance and the exit of the optical element is formed on the irradiation surface.

25. A light irradiation apparatus according to claim 23, wherein central axes of the optical element and the entrance and the exit of the optical element are fixed before and after the movement of the reflectors.

26. A light irradiation apparatus according to claim 23, wherein a beam entering the entrance at $60°<\theta<90°$ is reflected when an incident angle of the beam entering the entrance of the optical element is indicated by $\theta$.

27. A light irradiation apparatus according to claim 23, wherein the optical element contains an optical waveguide.

28. A light irradiation apparatus according to claim 23, wherein the light irradiation apparatus is used as a laser irradiation apparatus.

29. A light irradiation apparatus according to claim 23, wherein the light irradiation apparatus is used as an exposure apparatus.

30. A light irradiation apparatus comprising:
a light source;
an optical element having a pentagonal entrance and exit; and
a spherical lens which transfers a beam having a homogeneous intensity distribution formed by the optical element to an irradiation surface,
wherein the optical element has at least five reflectors which form the pentagonal entrance and exit, each of the at least five reflectors is movable relatively to another adjacent reflector.

31. A light irradiation apparatus according to claim 30, wherein a shape of the entrance and the exit of the optical element is a pentagonal shape having a golden ratio.

32. A light irradiation apparatus according to claim 30, wherein a beam spot having a shape of the entrance and the exit of the optical element is formed on the irradiation surface.

33. A light irradiation apparatus according to claim 30, wherein central axes of the optical element and the entrance and the exit of the optical element are fixed before and after the movement of the reflectors.

34. A light irradiation apparatus according to claim 30, wherein a beam entering the entrance at $60°<\theta<90°$ is reflected when an incident angle of the beam entering the entrance of the optical element is indicated by $\theta$.

35. A light irradiation apparatus according to claim 30, wherein the optical element contains an optical waveguide.

36. A light irradiation apparatus according to claim 30, wherein the light irradiation apparatus is used as a laser irradiation apparatus.

37. A light irradiation apparatus according to claim 30, wherein the light irradiation apparatus is used as an exposure apparatus.

38. A light irradiation apparatus comprising:
a light source;
an optical element having a triangular entrance and exit; and a spherical lens which transfers a beam having a homogeneous intensity distribution formed by the optical element to an irradiation surface, wherein the optical element has at least three reflectors which form the triangular entrance and exit, each of the at least three reflectors is movable relatively to another adjacent reflector, and shapes of the triangular entrance and exit have a similarity before and after a movement of the at least three reflectors.

39. A light irradiation apparatus according to claim 38, wherein a beam spot having a shape of the entrance and the exit of the optical element is formed on the irradiation surface.

40. A light irradiation apparatus according to claim 38, wherein central axes of the optical element and the entrance and the exit of the optical element are fixed before and after the movement of the reflectors.

41. A light irradiation apparatus according to claim 38, wherein a beam entering the entrance at $60°<\theta<90°$ is reflected when an incident angle of the beam entering the entrance of the optical element is indicated by $\theta$.

42. A light irradiation apparatus according to claim 38, wherein the optical element contains an optical waveguide.

43. A light irradiation apparatus according to claim 38, wherein the light irradiation apparatus is used as a laser irradiation apparatus.

44. A light irradiation apparatus according to claim 38, wherein the light irradiation apparatus is used as an exposure apparatus.

45. A light irradiation apparatus comprising:
a light source;
an optical element having a pentagonal entrance and exit; and
a spherical lens which transfers a beam having a homogeneous intensity distribution formed by the optical element to an irradiation surface, wherein the optical element has at least five reflectors which form the pentagonal entrance and exit, each of the at least five reflectors is movable relatively to another adjacent reflector, and shapes of the pentagonal entrance and exit have a similarity before and after a movement of the at least five reflectors.

46. A light irradiation apparatus according to claim 45, wherein a shape of the entrance and the exit of the optical element is a pentagonal shape having a golden ratio.

47. A light irradiation apparatus according to claim 45, wherein a beam spot having a shape of the entrance and the exit of the optical element is formed on the irradiation surface.

48. A light irradiation apparatus according to claim 45, wherein central axes of the optical element and the entrance and the exit of the optical element are fixed before and after the movement of the reflectors.

49. A light irradiation apparatus according to claim 45, wherein a beam entering the entrance at $60°<\theta<90°$ is reflected when an incident angle of the beam entering the entrance of the optical element is indicated by $\theta$.

50. A light irradiation apparatus according to claim 45, wherein the optical element contains an optical waveguide.

51. A light irradiation apparatus according to claim 45, wherein the light irradiation apparatus is used as a laser irradiation apparatus.

52. A light irradiation apparatus according to claim 45, wherein the light irradiation apparatus is used as an exposure apparatus.

* * * * *